(12) United States Patent
Andrew

(10) Patent No.: US 11,652,500 B2
(45) Date of Patent: May 16, 2023

(54) CONTAINERS FOR COMMUNICATION DEVICES

(71) Applicant: Resilicom Ltd, Hamilton (BM)

(72) Inventor: Jonathan Peter David Andrew, Salisbury (GB)

(73) Assignee: Resilicom Ltd., Hamilton (BM)

( * ) Notice: Subject to any disclaimer, the term of this patent is extended or adjusted under 35 U.S.C. 154(b) by 0 days.

(21) Appl. No.: 17/793,027

(22) PCT Filed: Feb. 15, 2021

(86) PCT No.: PCT/IB2021/051251
§ 371 (c)(1),
(2) Date: Jul. 14, 2022

(87) PCT Pub. No.: WO2021/161282
PCT Pub. Date: Aug. 19, 2021

(65) Prior Publication Data
US 2023/0047192 A1 Feb. 16, 2023

(30) Foreign Application Priority Data

Feb. 14, 2020 (GB) ...................................... 2002041
Nov. 20, 2020 (GB) ...................................... 2018281

(51) Int. Cl.
*H04B 1/036* (2006.01)
*H04B 1/38* (2015.01)
*H05K 5/06* (2006.01)

(52) U.S. Cl.
CPC ............... *H04B 1/036* (2013.01); *H04B 1/38* (2013.01); *H05K 5/061* (2013.01); *H04B 2001/3894* (2013.01); *H05K 5/069* (2013.01)

(58) Field of Classification Search
CPC .. H04B 1/036; H04B 1/38; H04B 2001/3894; H05K 5/061; H05K 5/069
See application file for complete search history.

(56) References Cited

U.S. PATENT DOCUMENTS

| | | | |
|---|---|---|---|
| 5,969,943 A | 10/1999 | Oyamada | |
| 6,374,912 B1 | 4/2002 | LaGrotta et al. | |
| 7,436,660 B2 | 10/2008 | Pedoeem et al. | |
| 2006/0262512 A1* | 11/2006 | Klein | H05K 5/0021 361/818 |

(Continued)

FOREIGN PATENT DOCUMENTS

| | | |
|---|---|---|
| CN | 102938990 A | 2/2013 |
| CN | 203479302 U | 3/2014 |
| CN | 206251536 U | 6/2017 |
| DE | 000215446 A | 11/1984 |

(Continued)

OTHER PUBLICATIONS

"Notification of Grant" in GB 2018281.2, dated Jan. 18, 2022.

(Continued)

*Primary Examiner* — Nguyen T Vo
(74) *Attorney, Agent, or Firm* — William H. Bollman

(57) ABSTRACT

A container for communication devices and communication systems used in cellular networks. There is a need for resilient systems that can withstand extreme weather events. Cellular network infrastructure located close to coastal regions is particularly prone to disruptive failures. A container for an electronic communications device is also provided including: a housing that surrounds at least one mounting plate on which electrical devices and electronic devices are supported. The housing is received around a top edge by a recess in a top plate and around a bottom edge by a recess in a bottom plate. The top and bottom plates are clamped to seal the housing. In some embodiments the housing is connected to a sea borne infrastructure such as buoy. Node frames enable a communications infrastructure that has no single point of failure.

20 Claims, 27 Drawing Sheets

(56) References Cited

U.S. PATENT DOCUMENTS

2011/0121734 A1    5/2011  Pape
2016/0144233 A1*  5/2016  Welker ............... G06Q 10/0639
                                                                                    700/91
2018/0139866 A1*  5/2018  Tian ....................... H05K 5/061

FOREIGN PATENT DOCUMENTS

GB          2288693 A    10/1995
GB          2592100 B     2/2022

OTHER PUBLICATIONS

"Intention to Grant" in GB 2018281.2, dated Nov. 26, 2021.
"Response No Further Objections" in GB 2018281.2, dated Jul. 5, 2021.
"Response" in GB 2018281.2, dated Apr. 23, 2021.
"Examination Report" in GB 2018281.2, dated Mar. 16, 2022.
"Examination Report CONT" in GB 2018281.2, dated Mar. 16, 2022.
"Combined Search and Examination Report" in GB 2018281.2, dated Jan. 15, 2021.
"Combined Search and Examination Report (CONT1)" in GB 2018281.2, dated Jan. 15, 2021.
"Combined Search and Examination Report (CONT2)" in GB 2018281.2, dated Jan. 15, 2021.
"Search Report" in PCT/IB2021/051251, dated May 26, 2021.
GB2018281.2 Letter Intention to Grant 18(4), dated Nov. 26, 2021.
Notification of Grant GB2018281.2 Letter, dated Jan. 18, 2022.
GB Grant Certificate GB2592100, dated Feb. 16, 2022.

* cited by examiner

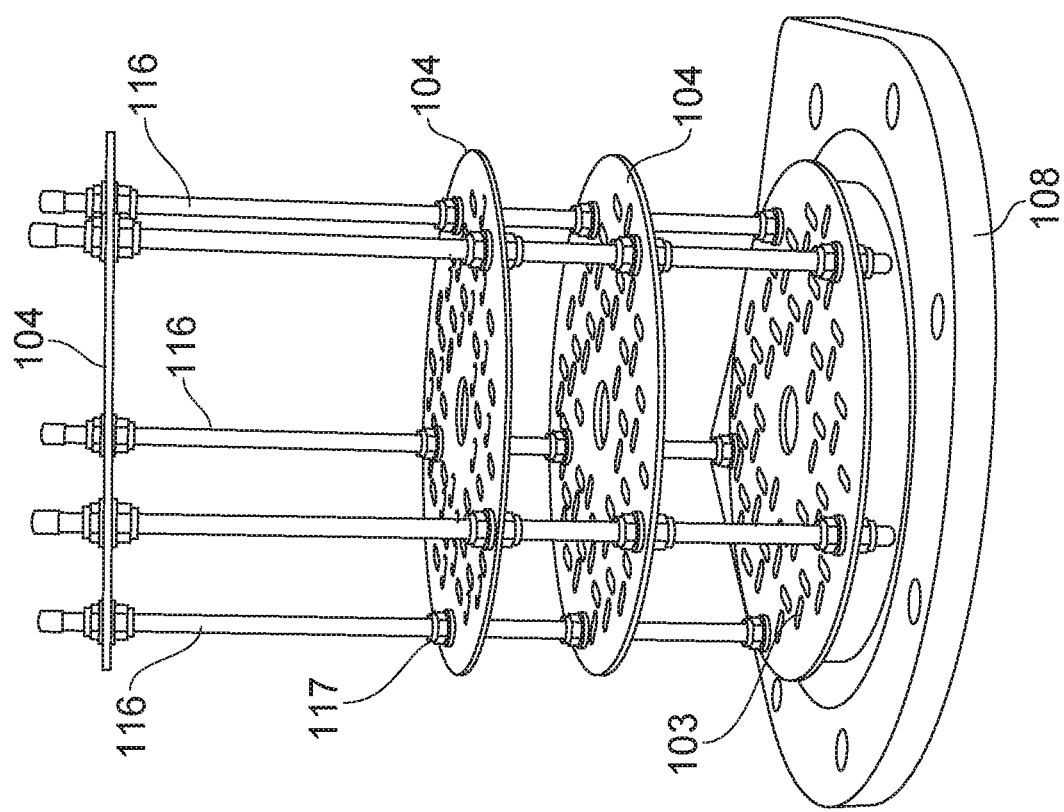
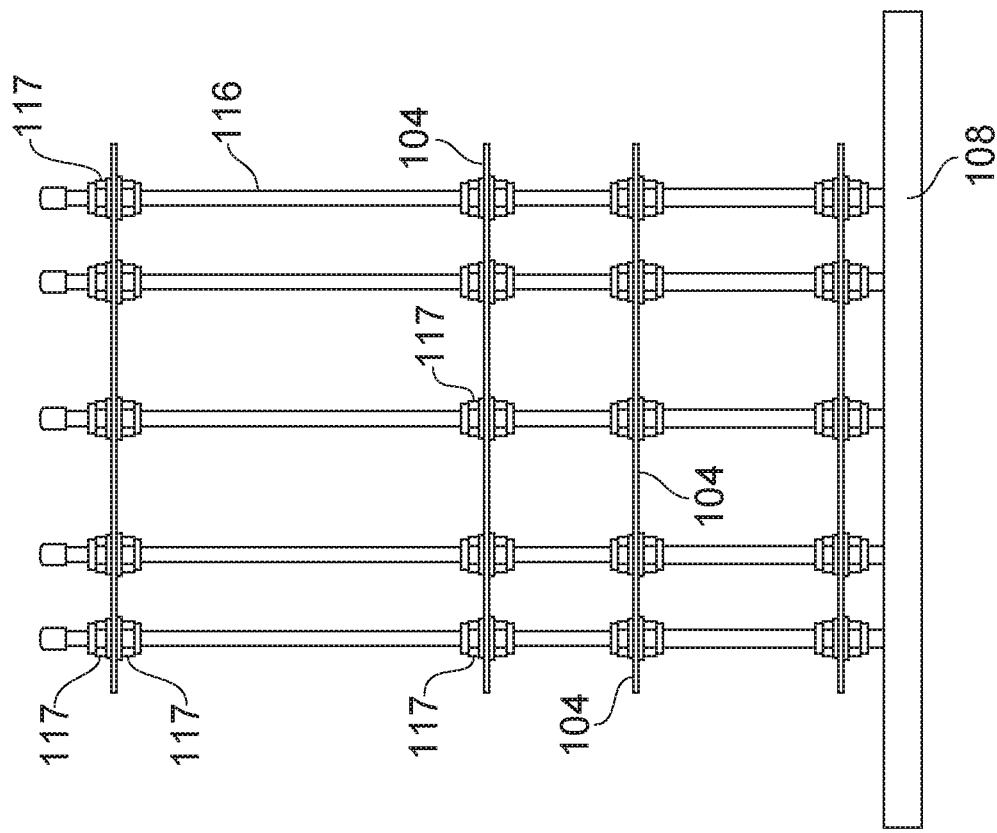

Detail A

Detail B

Detail C

CONTAINERS FOR COMMUNICATION DEVICES

FIELD OF INVENTION

The present invention relates to a container for communication devices and related communication systems. More particularly, but not exclusively, the invention relates to a container for providing resilience to communications devices for use in a telecommunication network, more particularly in a cellular network or a meshed topology communication system.

BACKGROUND OF THE INVENTION

Cellular communication networks are well known. Cellular communication networks typically comprise an array of wireless beacons or base stations arranged as cells which are inter-connected by high speed data networks. The cells of the communication network enable data transfer and the use of mobile telephones by facilitating bidirectional transmission and reception of radio frequency (RF) signals. By varying the size and number of cells within the network, communication is optimised for a specific geographic region depending on such factors as physical relief, population density, expected usage and coverage of locations within cells.

Base stations or beacons are arranged in an array of independent nodes and create an interconnected network of pathways for data. A problem occurs when there is a failure in one or more of the base stations or beacons and this can compromise the integrity of the network.

Automatic reconfiguring of networks tends to occur in the event of unplanned outages. This is known as cellular outage management which takes place automatically when failures occur and are detected, in order to mitigate outages in the networks. Networks are automatically reconfigured to operate autonomously in order to detect and derive signals from user equipment and base stations and alter the configuration of surrounding base stations in order to compensate for reduced coverage and service quality degradations in an attempt to satisfy performance requirements.

A number of techniques exist to detect and compensate for power or network outages. Some of these are mentioned below.

Self-organizing networks (SONs) are collections of functions for automatic diagnosis, optimisation and reconfiguration of cellular networks. SONs occur in base stations in a network and take into account multiple operating protocols (2G, 3G, 4G and higher) as well as evolved packet core (EPC) infrastructures. As mobile networks become more complex to configure and to maintain, SON functions provide cost savings and performance benefits in network deployment especially in emergency events and when there are unplanned outages or catastrophic failures and thereby help to ensure continued operation of systems.

Cellular network infrastructures, when located close to, or in coastal regions, are even more prone to damage especially from winds, in particular hurricanes or tornados. Base stations containing complex electronic and electrical equipment are especially prone to ingress of water and damage due to impact arising from collision damage from debris which may be waterborne or airborne.

Coastal regions and communities are therefore particularly vulnerable as they are liable to encounter more extreme winds speeds and storm surges and network infrastructure tends to be exposed to m ore aggressive environmental factors such as salt, water and very large forces from wind loading.

Furthermore, as cellular networks tend to have their peripheries that extend at or close to coastal regions, cellular network infrastructure located at, along or around coasts and shorelines are particularly prone to disruptive failures. Consequential impact of such failures or damage to base stations at edges of networks, even when implementing SON reconfiguration techniques, can have an exaggerated impact on overall system capability because there is an inherent lack of redundancy from adjacent base stations as there tend not to be so many extending beyond a shoreline.

There is therefore a need for resilient networks that can be relied upon in ever more testing and extreme weather events, for example due to climate change, especially at or around coastal locations.

PRIOR ART

United States patent application US 2017/0126333 (Alleco OY) discloses a floating communication device that includes a waterproof casing having a wireless communication interface for receiving and transmitting data; and an electromagnetic wave radiation cable that is attached to an external surface of the waterproof casing and inductively coupled to the wireless communication interface to transceive radio frequency signals between the wireless communication interface and an underwater communication device.

European patent application EP-A-2008367 (Ocean Power Industry) discloses a cellular communication system which includes an array of buoys disposed in a body of water. Each buoy includes a complete cellular system including a cellular transmission/reception site and associated electrical equipment for processing cellular signals.

International patent application WO-A2-200282830 (Morimoto Nobuyoshi) discloses a system and method for transmitting and receiving data in a mobile communications network. The system includes one or more mobile stations for transmitting data in a mobile digital network. The mobile stations are configured tact as buffer/repeaters by storing and forwarding data signals until they are received by a designated destination station.

United States patent application US2006/0262512 (Klein) discloses a modular electronics enclosure for one or more circuit card assembly devices. The enclosure includes top and bottom lids with at least one intermediate circuit card support member disposed therebetween. A spring clip clamps the top and bottom lids together around.

U.S. Pat. No. 6,374,912 (Lucent Technologies) describes a weather resistant cabinet for housing electrical equipment. The cabinet comprises a unitary tubular housing with two open ends. Two covers are attached to the two open ends of the tubular housing. The two covers include heat sinks and are preferably formed from aluminum using an extruding process.

United Kingdom patent application GB 2 288 693 (NEC Corporation) discloses an outdoor communication device which has a mounting base. The device includes a plurality of units and a cylindrical cover. The units are stacked and separately support electrical circuits for driving the device. The device body is a box shaped case and is suspended from and fixed to a mounting base.

German patent DD 215446 (Institute Fuer Nachrichtentechnik) discloses a hermetically sealed container which includes a ceramic portion for housing electronic signal amplification devices.

Chinese patent application CN 102938990 (Hu Yudong) describes a waterproof electrical box which comprises a casing, a lower cover, a waterproof rubber cover and a main board unit. The lower cover is arranged on an inner wall of a lower open-end portion. A waterproof ring is provided around a peripheral part of the inner convex wall and a through hole is arranged on a lower closed end portion of the lower cover. A clamping mechanism is arranged between the lower cover and the casing and a waterproof rubber cover plugs the through hole and is provided with a wire perforation hole.

Chinese utility model CN 203479302 (Aronx Technology Beijing Co) discloses a hydrological terminal device. A circular hole is formed in the middle of an upper cover base. An upper cover cap is screwed in the circular hole through the screw threads. The upper cover base is connected to a lower shell. The bottom of the lower shell is connected by way of an installation sheet and the lower shell contains a circuit board and a copper cylinder. The circuit board is fixed on the copper cylinder. A GSM aerial connector is connected to the lower shell. The GSM aerial connector has a seven-core aviation plug, an eight-core aviation plug and a ten-core aviation plug.

Chinese utility model CN 206251536 (Suzhou Shengshi Oct Software Tech Co) discloses a wireless transmission system which has a casing, a communication module, an antenna and a communication interface. Heat transfer fins are provided within the casing. A fan that is provided to force cool components.

An object of the present invention is to provide a mechanically strong, resilient and reliable container suitable for housing and protecting electronic communications devices and equipment for deployment in an immersed or semi-immersed state.

Another object of the invention is to provide a mechanically strong, resilient and reliable container suitable for containing and protecting electronic communications devices when deployed on a buoy, channel marker, offshore wind turbine, platform or an oil rig, typically within a 15 km range from a shoreline, more preferably less than 5 km from a shoreline and most preferably within 2 km, of a shoreline, so that telecommunications devices are able to be configured to be in communication with land-based devices.

An object of the invention is therefore to provide a mechanically strong, robust and resilient container for electronic communications devices which is able to withstand extreme weather conditions and impact forces.

A further object of the invention is to provide a mechanically strong, robust and resilient container for electronic communications devices which is capable of operating in two or more different communication networks or channels. Therefore, in the event of disruption or signal outage, routing of signals may be achieved via an alternative network or channel in order to maintain overall network integrity.

SUMMARY OF THE INVENTION

According to a first aspect of the present invention there is provided a container for an electronic communications device the container includes: a housing that surrounds at least one mounting plate on which electrical devices and electronic devices are supported, at least one heat sink is in thermal contact with the at least one mounting plate, the at least one heat sink has apertures formed therein to allow convective cooling of the at least one mounting plate; the housing is received around a top edge by a recess in a top plate and around a bottom edge by a recess in a bottom plate; at least one rubber or elastomer gasket is disposed in at least one of the recesses; a clamp means exerts a force to clamp the top and bottom plates to seal the housing therebetween; and a socket which receives a connector for a power supply and/or a data line, over which data is sent to, and received from, at least one antenna which is exterior of the housing.

Ideally the socket is of the type that is waterproof and able to lock the power supply and/or a data line securely to the container in order to ensure electricity supply and signal continuity.

The container is used to create a node that does one or m ore of the following: radio frequency communications; internet protocol communications; and environmental data monitoring, collection and distribution.

Each of these forms of communication are meshed: interlinked with two or more other nodes in order to create a node frame. Another advantage is that the device is able to reconfigure to one of several different wireless channels in the event of network disruption. Therefore a node is able to re-route an incoming signal arriving on a first communication channel or network and relay a corresponding signal on a second communication channel or network, in the event that the node is unable or prohibited from relaying the incoming signal on the first communication channel or network. This situation may occur where infrastructure in the first communication channel or network is damaged or otherwise compromised.

The corresponding signal may be a repeated signal of the incoming signal or a warning or advisory message that a network or channel has been compromised and therefore one or more specific signals transmitted on that network or channel are unable to be relayed or broadcast. The container is ideally part of a repeater network and is connected to at least one adjacent container as part of a meshed network, triangulated network or a daisy chain array.

On board batteries are ideally charged by way of a number of multiple power sources which are arranged to provide independent power supply to independent communications equipment which may be part of, or constitute, a network node. The batteries are housed within the containers. The independent power supplies include: a local source of electrical power, provided by a back-up battery, one or more photovoltaic (PV) solar panels or wind turbines. Optionally, when deployed on a buoy, a wave energy converter (WEC) responsive to waves in the body of water, is adapted to generate electricity for powering associated equipment which process signals, so that a cellular network system can be continuously operated without any additional or external power source.

An advantage of the invention is that it enables operators to use more available bandwidth of radio frequency spectrum to enable devices to communicate. The invention also facilitates systems to operate using existing telecommunication infrastructure, network IP protocol and even short range wireless protocols, such as Bluetooth® wireless protocol, in order to reconfigure and infill when damage is sustained to infrastructure in a network.

Containers when fitted with requisite telecommunications equipment operate as nodes to communicate one with another. As the container is a passive item of infrastructure it enables different telecommunication, different internet providers and different customers to deploy them as part of specific infrastructure in order to improve the resilience of particular communication systems.

The container is preferably included in a communication system in order to improve network resilience in order to reduce risk of damage during severe weather events. Ideally existing marine architecture is adapted for use with and to provide support for and/or an anchor point for the container.

Ideally the clamp means comprises a plurality of rigid shafts extending through apertures formed in the top and bottom plates. Preferably tightening means is provided on each shaft to press the top and bottom edges into the, or each, rubber or elastomer gasket. These tightening means may be of the type that require a specific torsional force in order to provide optimum clamping whilst ensuring integrity of the gasket.

In some embodiments the clamp means comprises a plurality of connectors, each passing through an aperture formed in at least one of the plates; and a resiliently deformable bush is located in each of the apertures and surrounds each of the connectors; and a lock nut is connected to a threaded end of each of the connectors. An interface includes a waterproof connection from an interior of the housing to an exterior of the housing.

As cooling of the electrical devices and electronic devices housed within the container is important, at least one heat sink is in thermal contact with the at least one mounting plate. Optionally the at least one heat sink has apertures formed thereinto al low convective cooling of the at least one mounting plate.

In some embodiments a fan is provided to force a cooling fluid, such as air or an inert gas, such as nitrogen, contained within the device to cool the at least one heat sink. In addition internal surface profiling of the housing may provide features, such as protuberances or ribs, in order to direct fluid flow and so promote cooling. Protuberances may be ridges, or fins and may follow a helical path.

In some embodiments, the container includes at least one mounting plate which is arranged so that when the electronic communications device is deployed, the at least one mounting plate is retained horizontally, and vertical fins extend therefrom in order to improve convective cooling of the at least one mounting plate.

The socket which receives the connector for a power supply and/or a data line, is weatherproof and waterproof and is preferably located in a recessed part of the base of the container and within a protected portion of the housing. This ensures power and data to be sent to, and received from, the at least one antenna from/to the electrical devices and electronic devices, remains intact and operational.

The container is capable of housing telecommunications equipment for operating in at least the following bandwidths and radio frequency protocols: a short range radio frequency band, a VHF and UHF bands, a wireless local area network (LAN), a short-range personal wireless area network, such as Bluetooth® wireless protocols, a 3-G RF, a 4-G RF and a 5-G RF.

Ideally the container has a means for receiving and retaining at least one lanyard, by way of one or more attachment points, which are provided on an exterior of the housing.

Preferably at least one hardware or software sensor is operative to sense a fault and to transmit an alert signal indicating the fault. The signal may indicate a fault on a power line, a low level of a non-board battery, a signal line or a fault with a neighbouring base station or a fault associated with one or more communication networks or channels.

Ideally a plurality of containers is interconnected to define a communication system and are deployed in a cellular arrangement. At least one processor, such as a microprocessor, is operative to process signals for transmission to at least one antenna in a container and to process signals received from the at least one antenna. Memory is coupled to the microprocessor and is updated and refreshed by an independent power supply. This is particularly advantageous where cached data has to be re-routed or a stored data queue has to be forwarded in the event of a disruption in a communication pathway or failure of a node, such as a repeater or base station, in a network. The speculative store value to the load (store-to-load forwarding) requires a microprocessor to have knowledge of whether a given load depends on an earlier not-yet-committed store, but this is much harder than figuring out register dependencies.

The system is ideally configured to cause transmission of an interrogation signal from a first electronic communications devices to a second electronic communications devices to determine whether the second electronic communications devices is operative for call forwarding.

The housing may be seen as an independently powered pod adapted for use with navigational buoys, weather or aquatic super structures, such as oil well platforms, gas rigs and wind turbines 130 structures.

Preferably the container is formed from a marine grade stainless steel, such as stainless steel grades 304, 316 and duplex steels which provide corrosion resistance and durability.

It is appreciated that although reference has been made to seaborn or maritime applications, the container may be adapted for use in land based deployment, for example on commercial and residential buildings, masts or towers.

It is further appreciated that the container which houses the node frames, can be deployed on a semi-permanent basis in one or more compromising environments, such as: under water, underground, in extreme heat and in extreme cold. Therefore the container housed node frames can remain resilient in adverse weather conditions, such as hurricanes and typhoons.

The container housed node frames can be deployed quickly on commercial and/or residential locations quickly and without expertise. This enables rapid and agile deployment of node frames in high risk and/or compromised environments, such as in post hurricane locations.

An embodiment of the invention will now be described by way of example oily and with reference to the Figures in which:

BRIEF DESCRIPTION OF FIGURES

FIGS. 8a and 8b show respectively an elevational view and overall view of the embodiment shown in FIG. 8;

DETAILED DESCRIPTION OF PREFERRED EMBODIMENTS OF THE INVENTION

Figure 1:
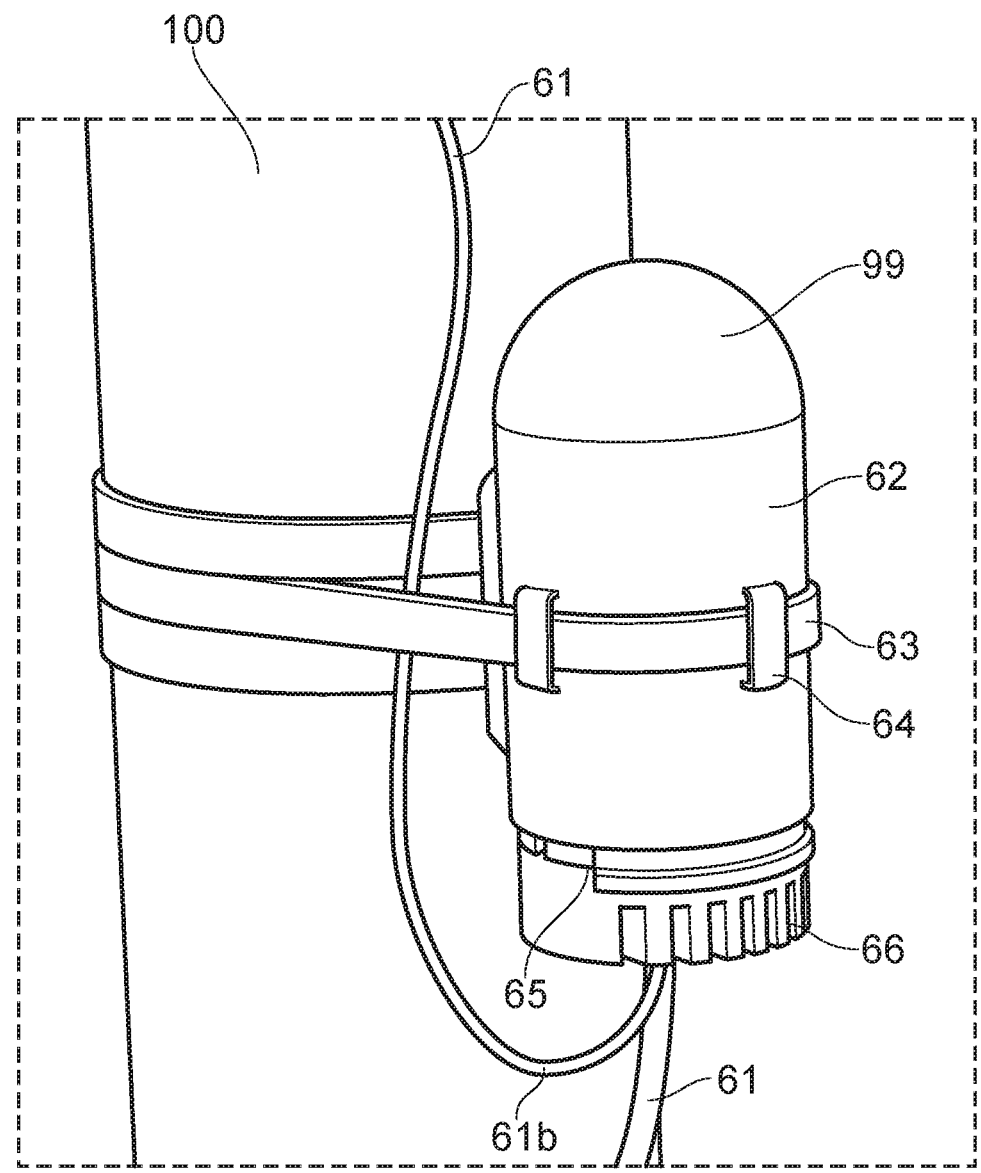
FIG. 1 shows an isometric view of an embodiment of the device according to the present invention, in use on an underwater pile or marker structure.

With reference to FIG. 1 there is shown an embodiment of the container 99 comprising a telecommunications node device comprising a housing 62 for enclosing telecommunications apparatus 46, which includes electrical and electronic devices. The apparatus 46 comprises a transceiver (not shown) and the housing provides a waterproof internal enclosure and comprises an attachment means 64, which includes flexible strapping 63 for attaching the container 99 to a structure 100.

Figure 2:
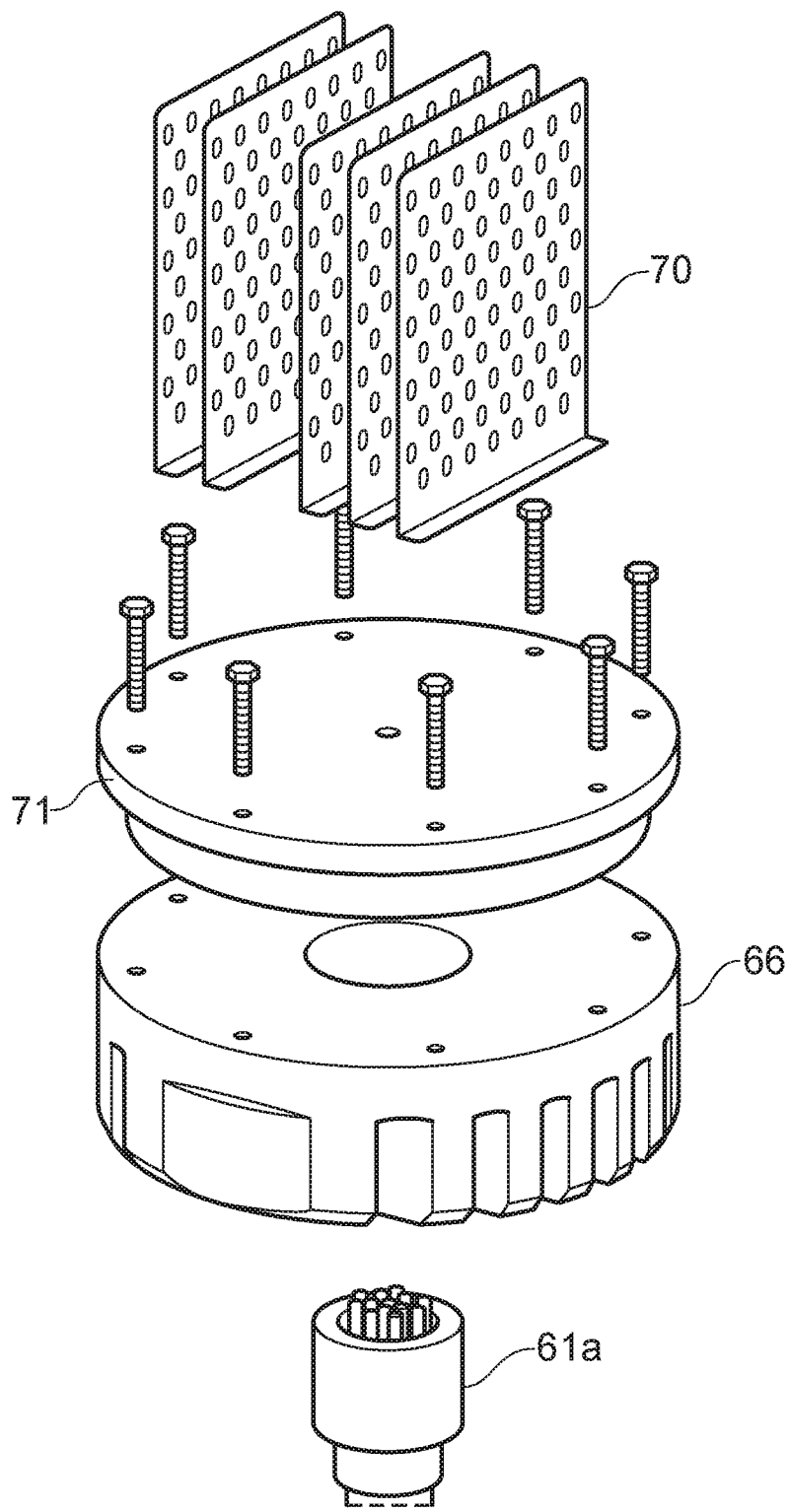
FIG. 2 shows an isometric exploded detail view of the embodiment shown in FIG. 1.
Figure 3:
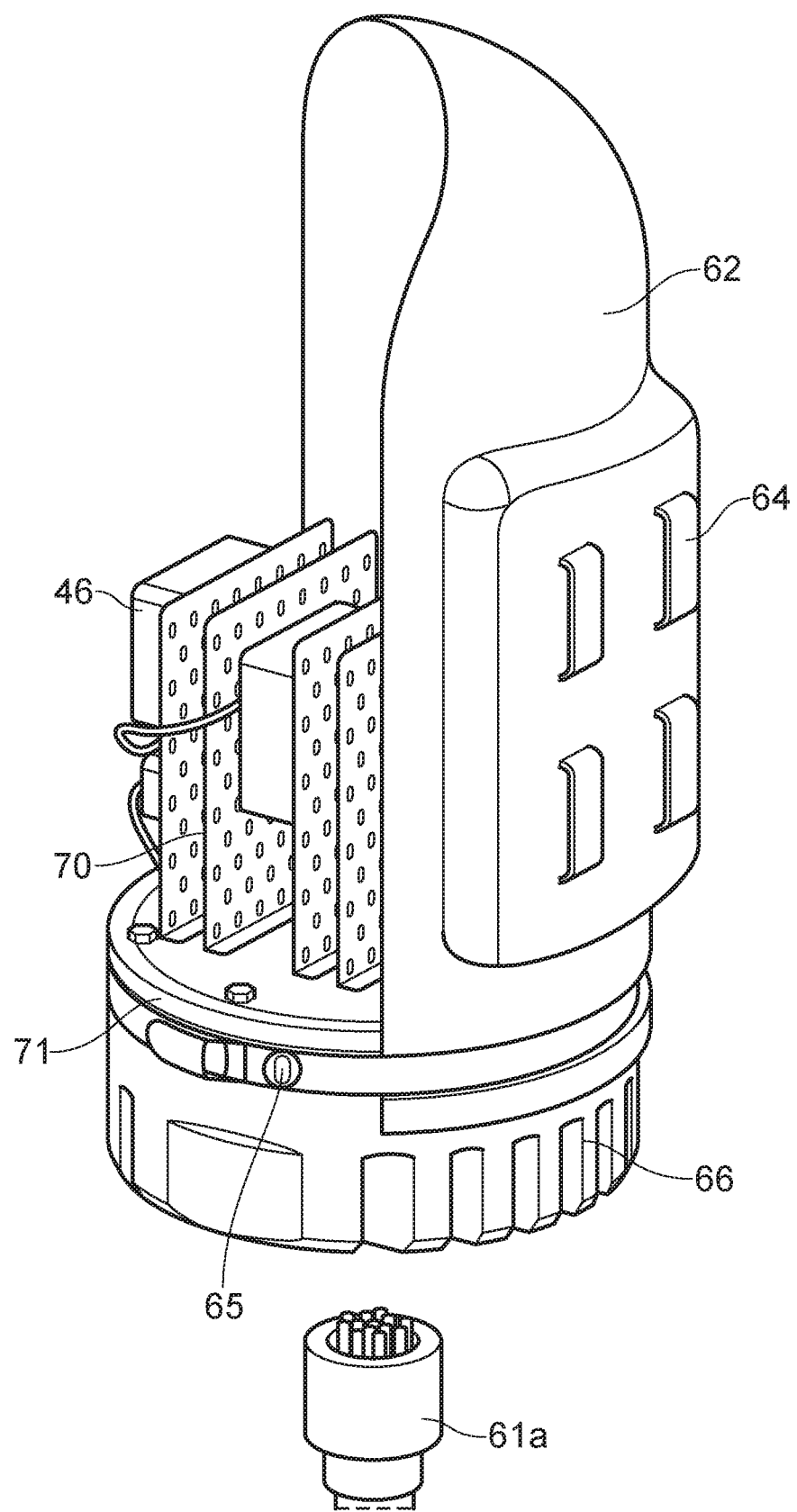
FIG. 3 shows an isometric partial sectional view of the embodiment shown in FIG. 1.
Figure 4:
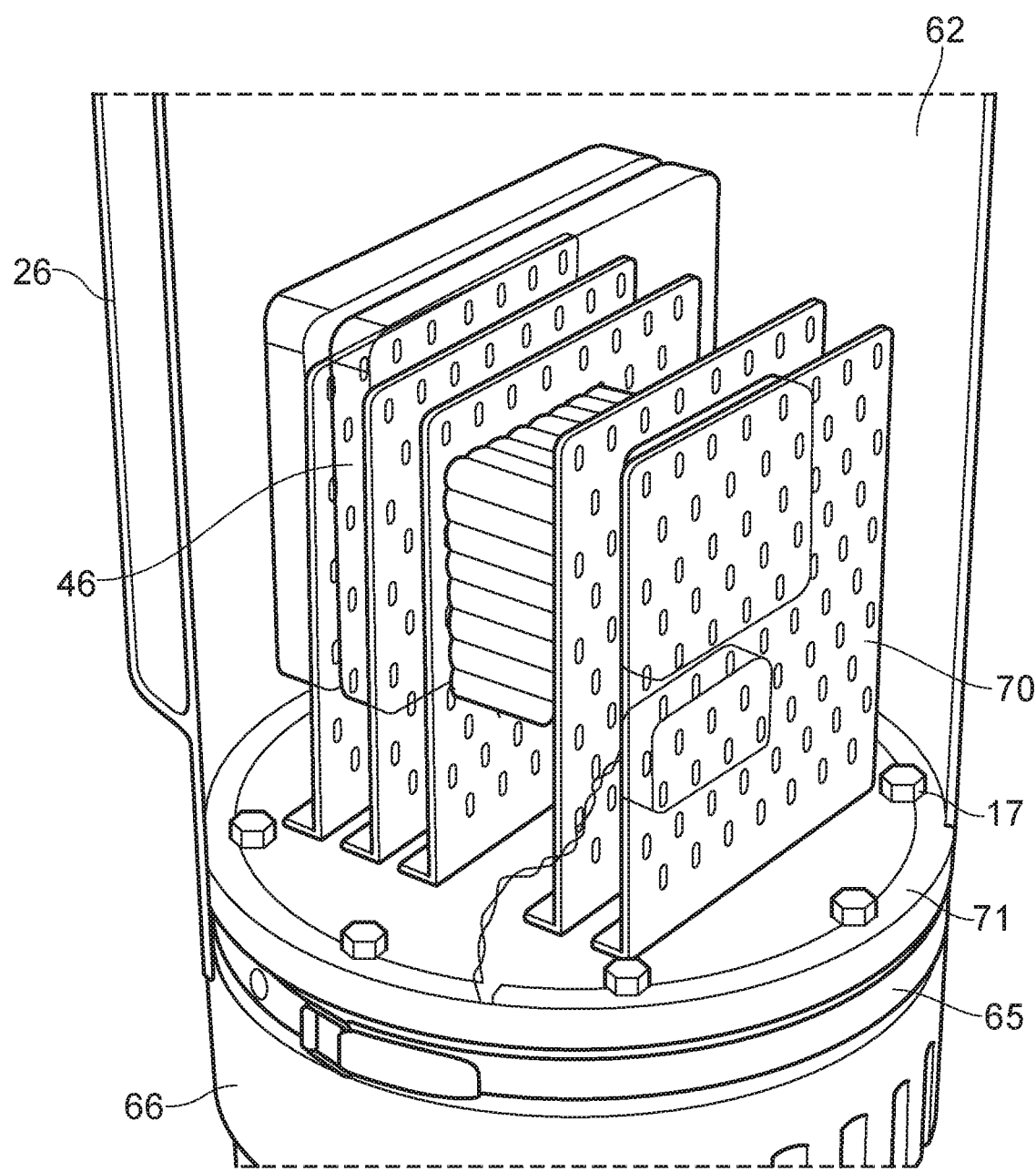
FIG. 4 shows an isometric partial section detail view of the embodiment shown in FIG. 1.
Figure 5:
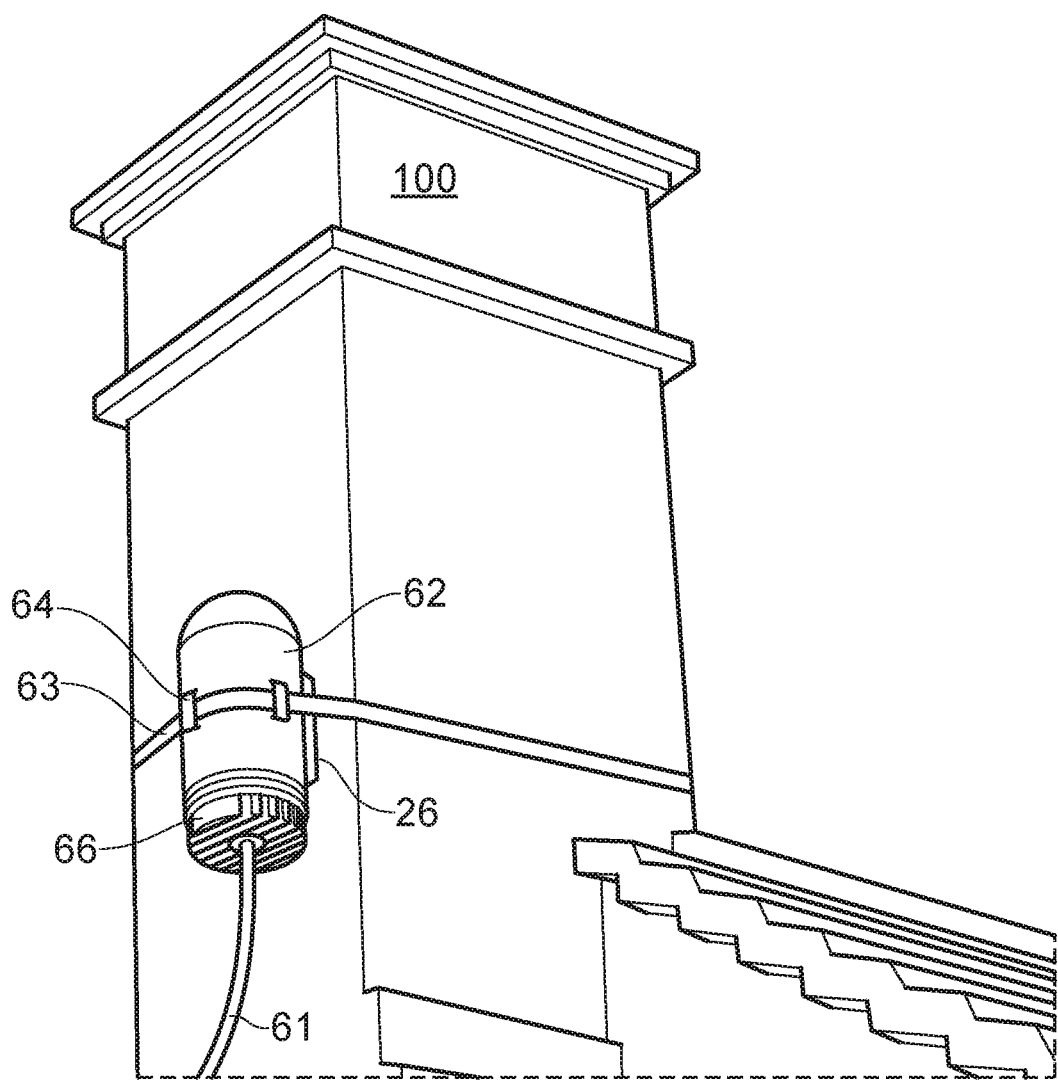
FIG. 5 shows an isometric view of the embodiment shown in FIG. 1, in use on a house.

FIG. 2 shows a plurality of mounting plates 70, onto which the telecommunications apparatus 46 is mounted. A closure mechanism 65 is provided close to the housing and provide a watertight seal to the enclosure.

The pictured embodiment of the container defines a cylindrical housing, which may have a domed top. The housing may be envisaged to be made of PU (polyurethane) rubber, fibre glass or carbon fibre depending on application or environment.

The bottom provides entry to the enclosure and is closed in use by the heat sink 66. The heat sink 66 is formed from aluminium, or other heat conducting, marine grade metal and comprises fins lowermost.

The aluminium heat-sink transfers the heat from the apparatus 46 from inside the enclosure to outside the housing 99, so that heat is transferred from hot to cold areas.

The apparatus 46 is connected through the bottom, whereby there is a connection through the centre of the heat sink 66, comprising a potted connection for connection of a connector plug and communication link or wire 61. The apparatus 46 includes apparatus for signalling, telecommunications and environmental monitoring.

In the pictured embodiment mounting plates 70 are arranged vertically, spaced apart within the enclosure. The apparatus 46 in use is secured to these plates so as to provide secure mounting. The mounting plates 70 are secured on a circular base 71 which has a central perforation for the communication link or wire 61 and is connected to the heat sink 66.

The securement means for the housing comprises a plurality of fixed lanyard attachment points 64, spaced circumferentially midway on the housing. The lanyard attachment points 64 are utilised in use with a flexible strapping 63, which strapping is passed around the housing, through the lanyard attachment points and around or onto the structure 100.

Four such attachment points 64 are provided on a rectangular extending plate 26 extending from, attached to, and spaced from the housing wall, so as to provide a rigid attachment base and/or spacing the housing from the structure in use. This means of securement allows for substantial flexibility of mounting options, and structures. The strapping may be tightened using a ratchet, allowing easy rem oval and adjustment. The closure mechanism 65 is located around the bottom ending of the housing and is arranged to secure the housing 62 to the heat sink 66 or base 71.

The attachment means 63 comprises a band with an over centre clip. The mechanism includes a flexible gasket internal the housing, which gasket provides an airtight and liquid seal. The gasket comprising a resiliently deformable material which forms an hermetic seal.

In this way the device of the present invention may enable an integrated, marine communications platform, whereby small cell nodes may be based on both land (shore and high ground) and sea (fixed buoys and channel markers) and deployed in areas of poor mobile coverage and/or strategic importance.

Small cells provide radio access points for telecommunications. A multi operator neutral host (MONeH) means any telecommunications or internet provider is able to have access to the service operating on and supported by the electronic devices contained in the housing. For example, where a neutral host means no single telecoms or internet service provider owns the network infrastructure.

Figure 6A:
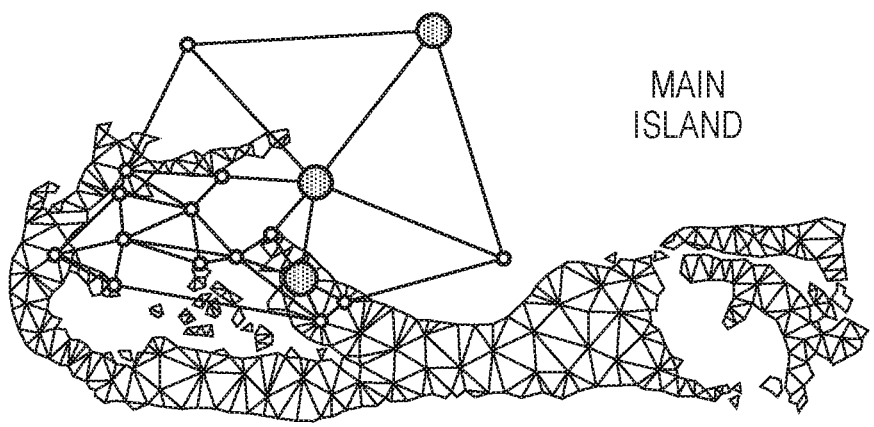
FIGS. 6a to 6c show diagrammatic views of systems deployed offshore in meshed and local networks, within a marine environment, to create nodes that provide a resilient extension to a mobile and broadband network.
Figure 6B:
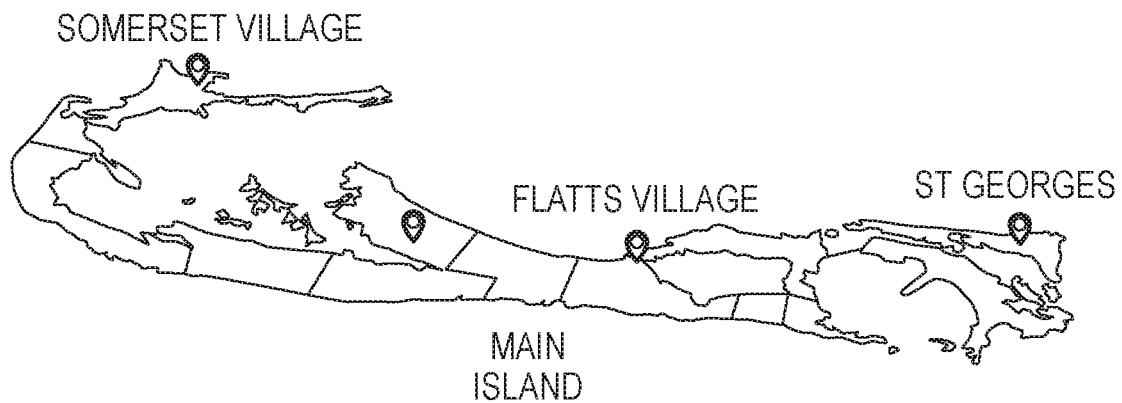
Figure 6C:
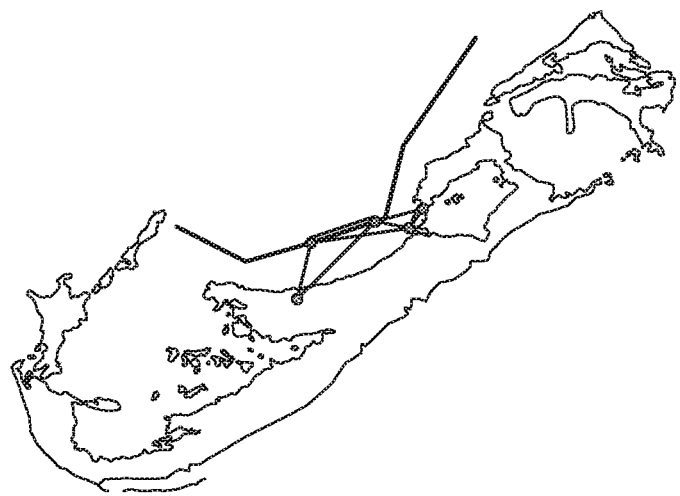

A meshed network as enabled by the devices in a form as displayed in FIGS. 6a, 6b and 6c ensures each node or device has the capacity to be a primary receiver and sender of data. Nodes are connected to at least one other nodes in the infrastructure network and is able to reconfigure so there is therefore no catastrophic system failure in the event of a single point or node outage.

Integrated with marine sensor telemetry, these nodes provide an extension of a mobile telecoms and broadband network, as well allowing for provision of environmental data.

For example integrated in the device, marine sensor telemetry apparatus may enable the water quality around marine structures to be monitored. Live data may then be provided without the need to physically visit the site and coral aquaculture and other marine conservation activities can be facilitated. Improved data, both frequency and detail of ocean ecosystem markers enhances risk modelling.

The deployment enabled by the devices may add resilience to a communication network as the devices allow the network to remain active in adverse weather conditions.

Thick metal mounting plates transport heat away from electrical and electronic devices. A thermal compound may be used optionally to aid heat transfer, and underwater deployment of the device enables cooling and wind protection.

The enclosure comprises a humidity sensor 71a, which is arranged to alert as to presence of aberrant levels of moisture or humidity to indicate ingress of water into the enclosure. The sensor is arranged to travel circumferentially about the housing to ensure monitoring at any point of the seal, even when the housing is inclined at an angle and to transmit a warning or fault to an adjacent node in a network so as to forewarn of an imminent failure event, should extreme damage be sustained which leads to water ingress.

The humidity or water sensor 71a is integrated into the base 71 to detect any minor leakage at early stage. All sensors are connected to the system to monitor the status of each container in a cell.

Heat-sinks 66 are removable to aid ease of maintenance. Anti-fouling coating may also be applied to an exterior surface of the housing to render it more resilient to harsh environments.

Figure 13:
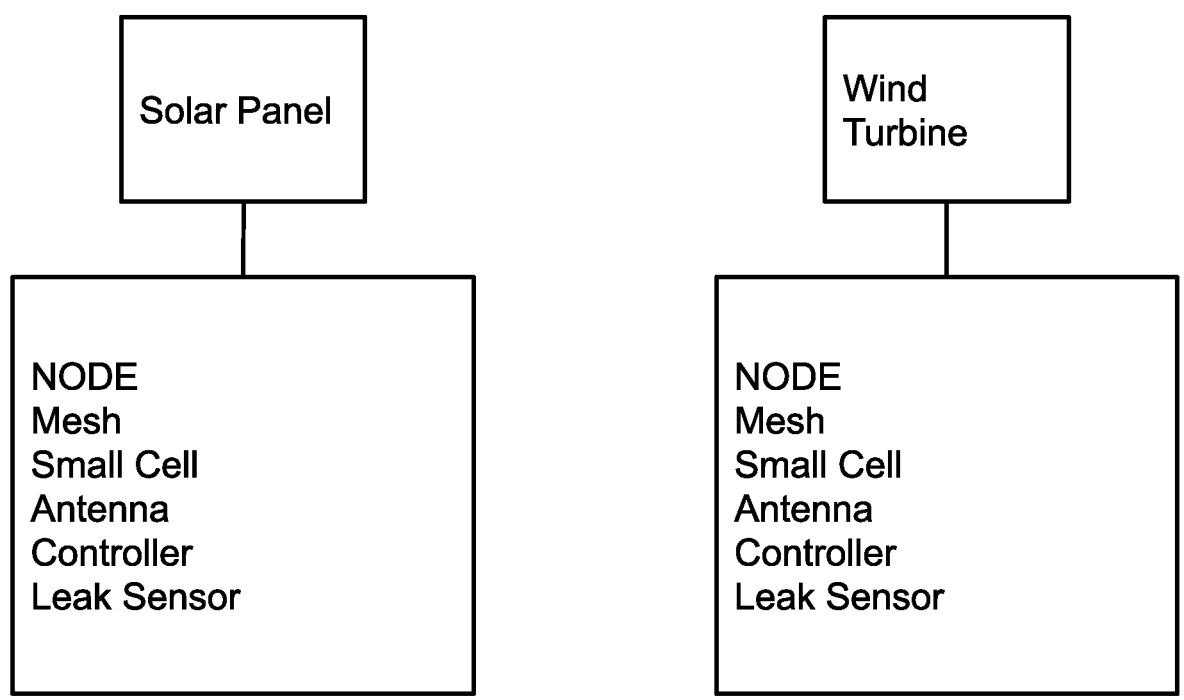
FIG. 13 shows the principle of how a container, is deployable on land and at sea, and how different external power sources may be connected thereto.
Figure 14:
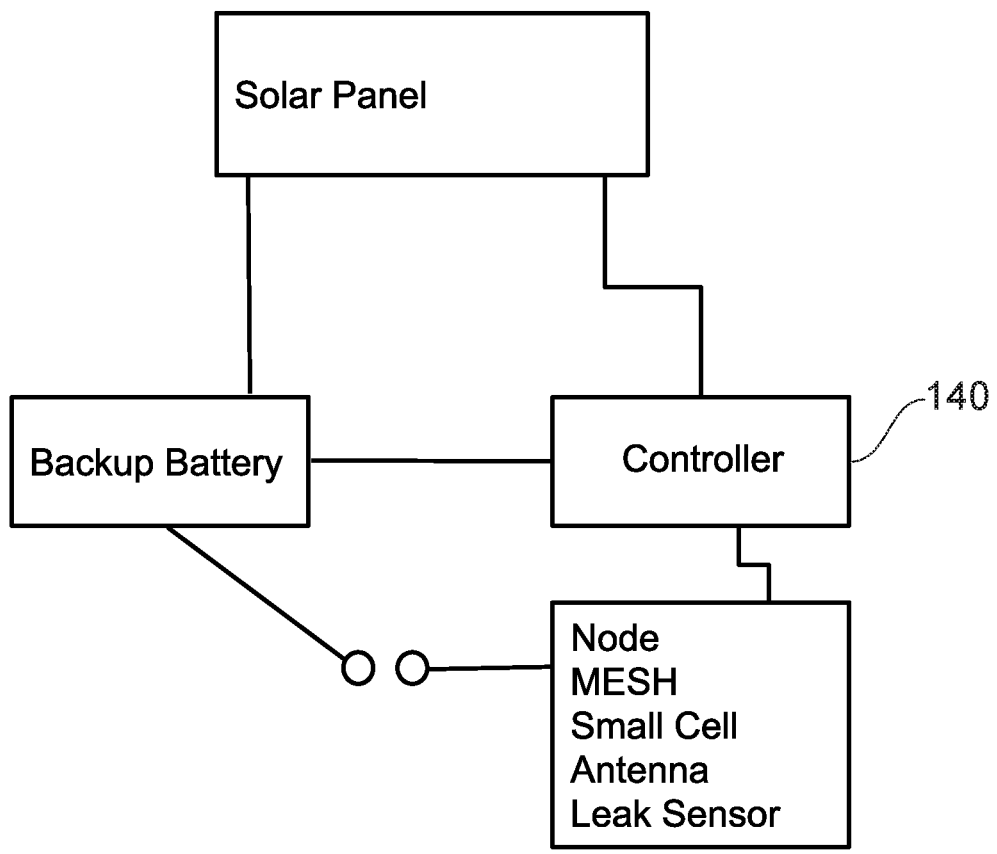
FIGS. 14 and 15 show how a node is capable of being powered by different power supplies.
Figure 15:
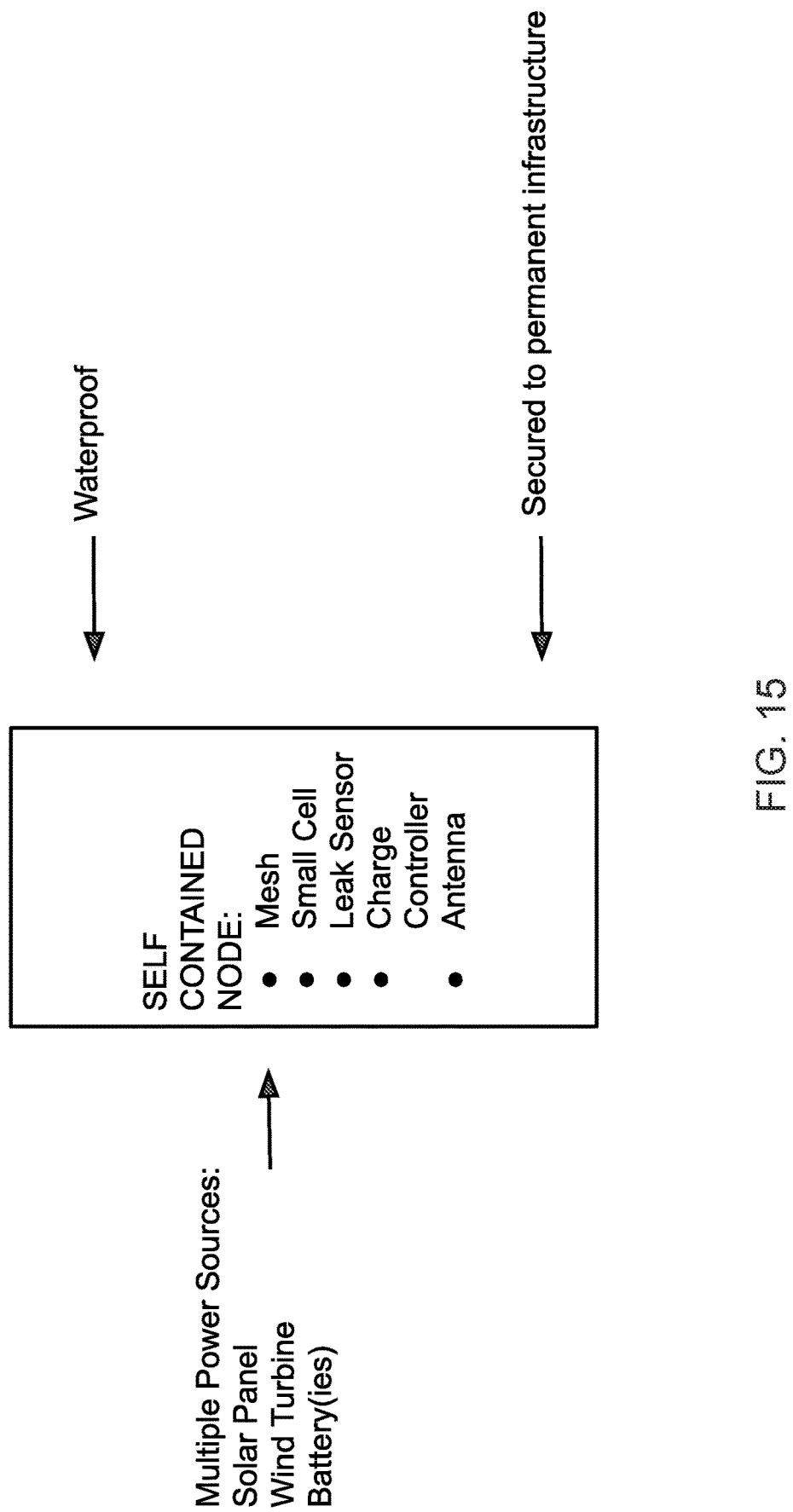
Figure 16:
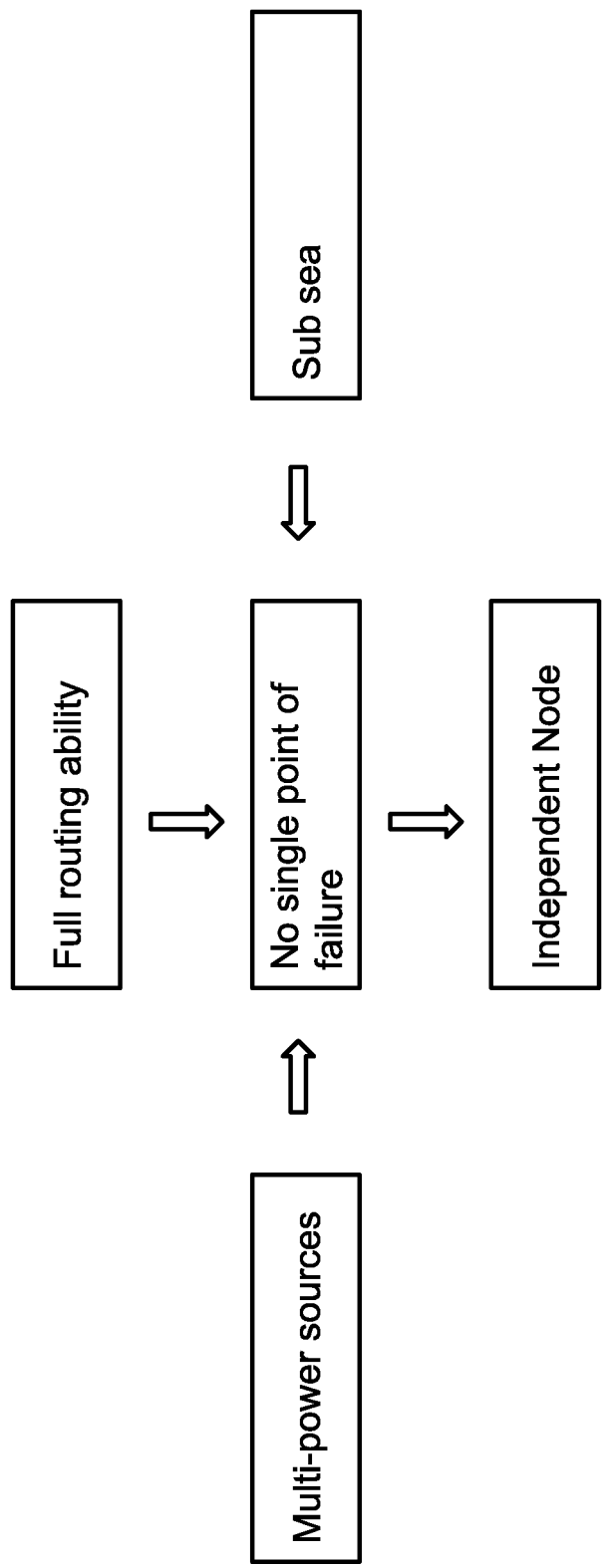
FIG. 16 illustrates the principles of independence of anode.
Figure 17:
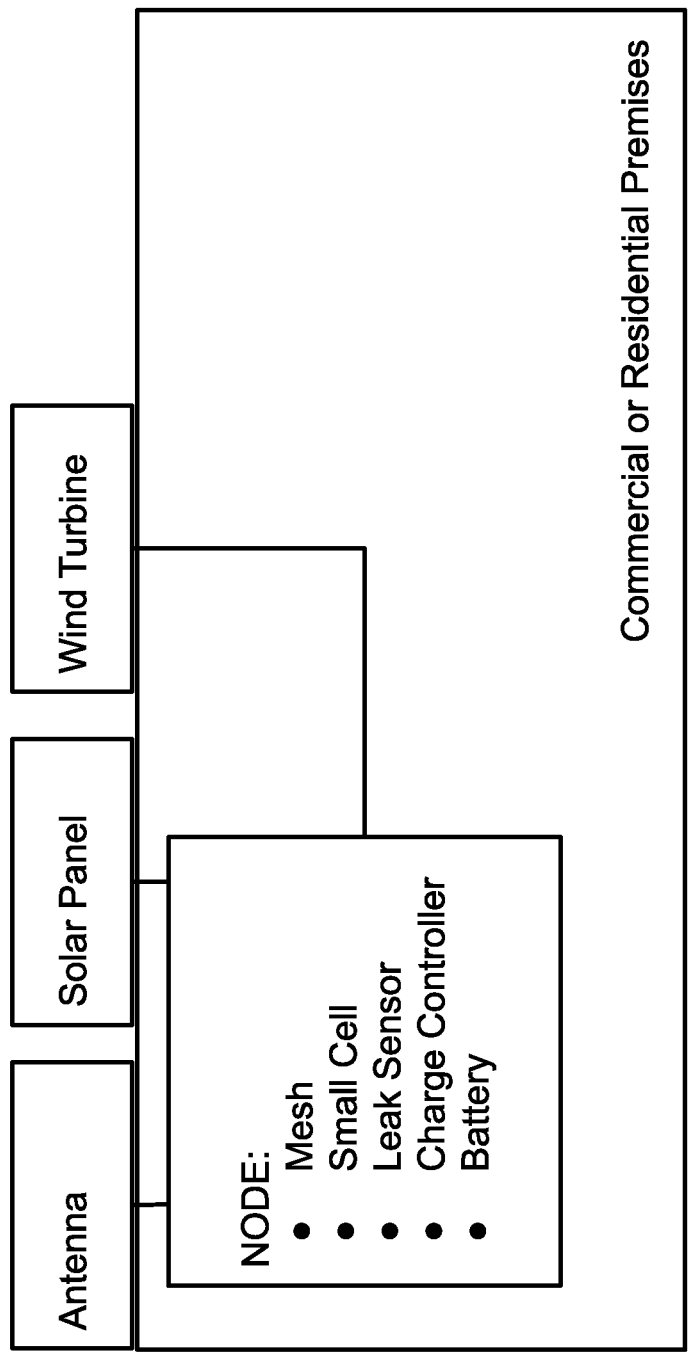
FIG. 17 illustrates key feature of another embodiment of a land based node.

The improvement of island telecommunications and increasing overall global competitiveness is provided by the devices. Telecommunications and power infrastructure are at risk in extreme weather conditions and the meshed network infrastructure, shown in FIGS. 6a, 6b and 6c, created by these devices seeks to address these concerns. The container 99 may be mounted to a channel marker in water, with small cell antennae, for above water mounting to the channel marker with the benefits depicted in FIGS. 14 to 23. The container may include or be connected to one or more solar panels 140 and/or a battery array, as shown in FIGS. 13, 14 and 17.

Figure 7:
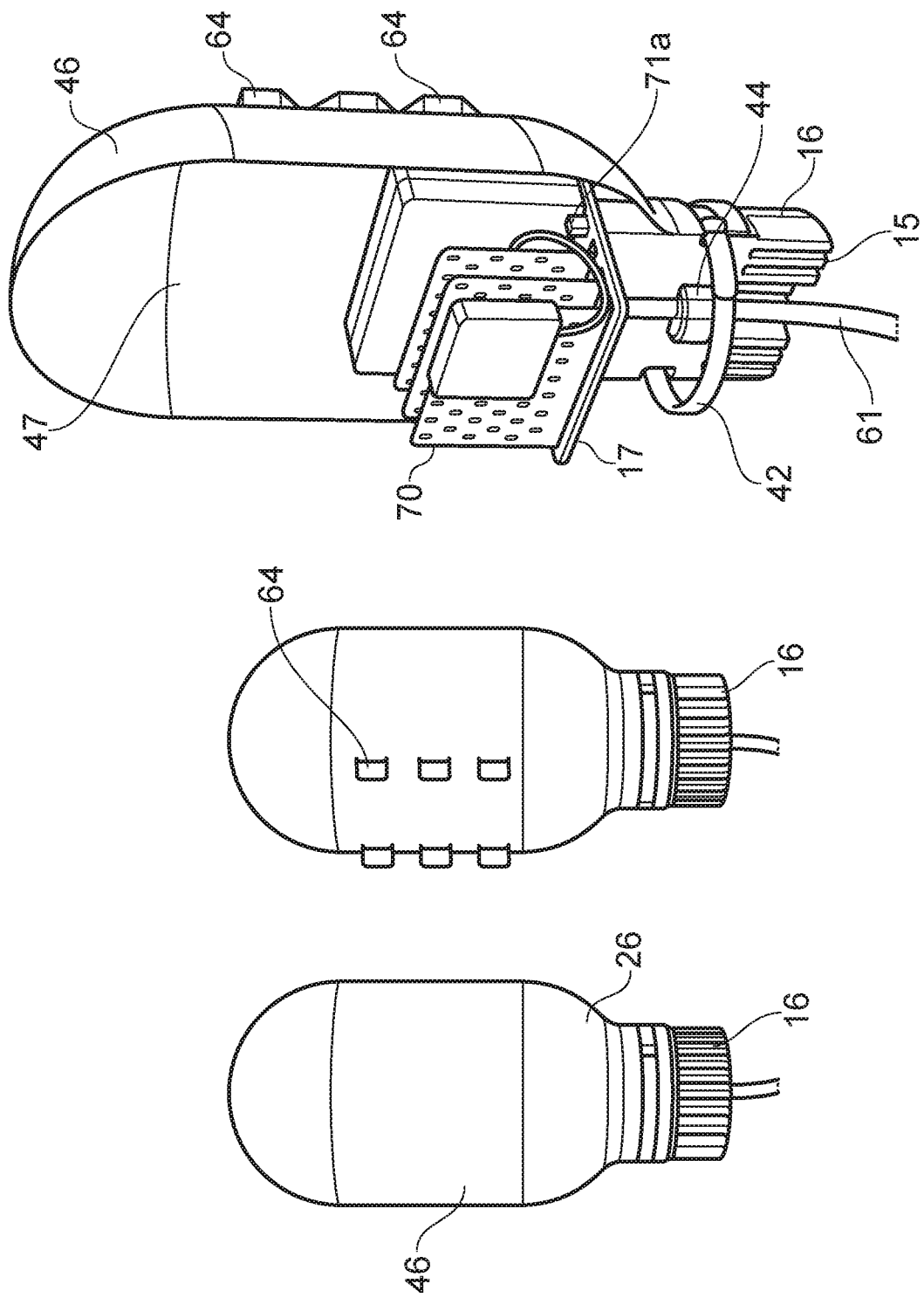
FIG. 7 shows two side views and an isometric sectional view of a second embodiment of the device according to the present invention.

With reference to FIG. 7 another embodiment of the invention generally comprises telecommunications node device comprising a rectangular plate 26 for telecommunications apparatus 46. The apparatus comprises a transceiver and the housing provides a waterproof internal enclosure 47. An attachment means 64 receives a lanyard or strapping the apparatus 46 to a structure such as a building or post. The enclosure 47 encloses a plurality of mounting plates 70 which extending vertically from a rectangular base plate 17 on which the apparatus is mounted.

A closure mechanism 65 closes the housing and provides a watertight seal to the enclosure. The closure mechanism may comprise a screw thread to open the top of the housing, which has a pinched neck below the base plate, so as to permit access the apparatus. A drum lock ring 42 encloses the internal of the apparatus 46 around its base. The closure mechanism comprises an over centre clip on a stainless steel metal band, closing against a resiliently deformable sealing ring 56. A communications wire 61 passes through a permanent potting 44 seal, for example resin.

Figure 8:
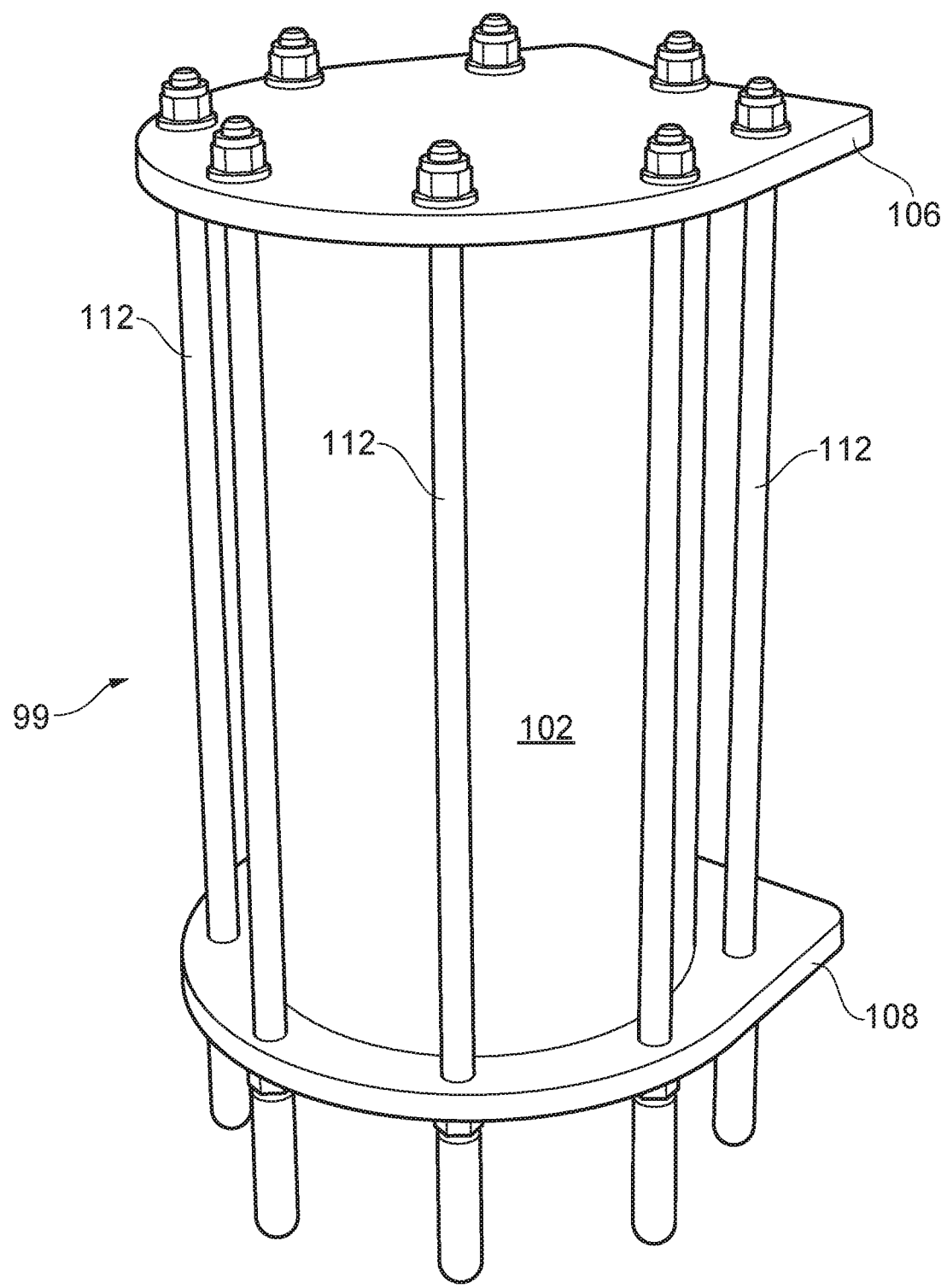
FIG. 8 shows an exploded isometric view of another embodiment of the invention.
Figure 8D:
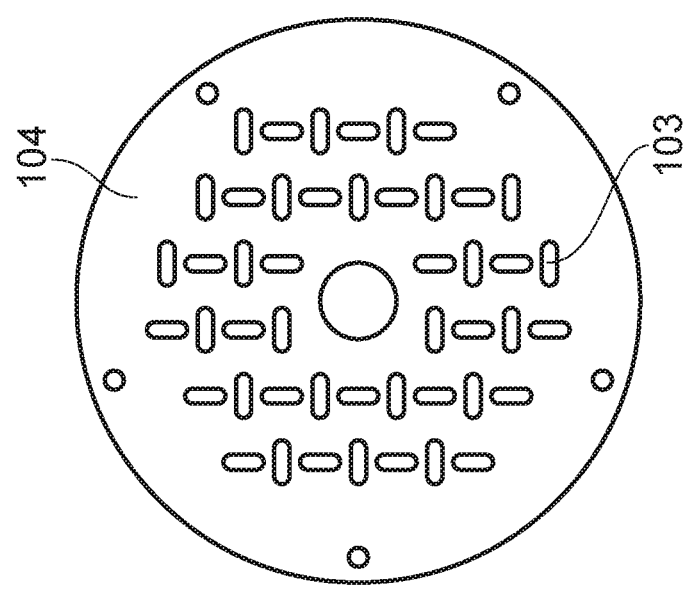
FIG. 8d shows a plan view of the embodiment shown in FIG. 8.
Figure 8C:
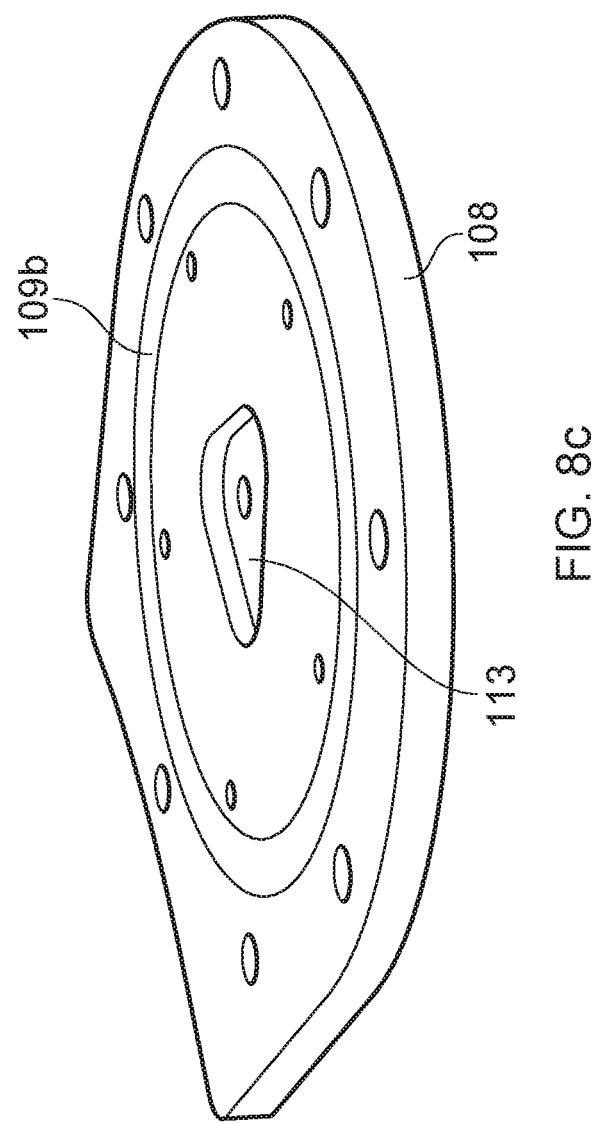
FIG. 8c shows an overall view of a base plate.

FIGS. 8 and 8a to 8d show views of an alternative embodiment of the container 99 for housing an electronic communications device. The container 99 includes: a housing 102 that surrounds at least one mounting plate 104 on which electrical devices and electronic devices (not shown) are supported. At least one heat sink (not shown) is in thermal contact with the at least one mounting plate 104. The mounting plate 104 has apertures formed thereinto enhance convective cooling through the mounting plate 104. The housing is received around a top edge by a recess 109a in a top plate 106 and around a bottom edge by a recess 109b in a bottom plate 108. An example of the bottom plate 108 is shown in FIG. 8c.

Figure 9:
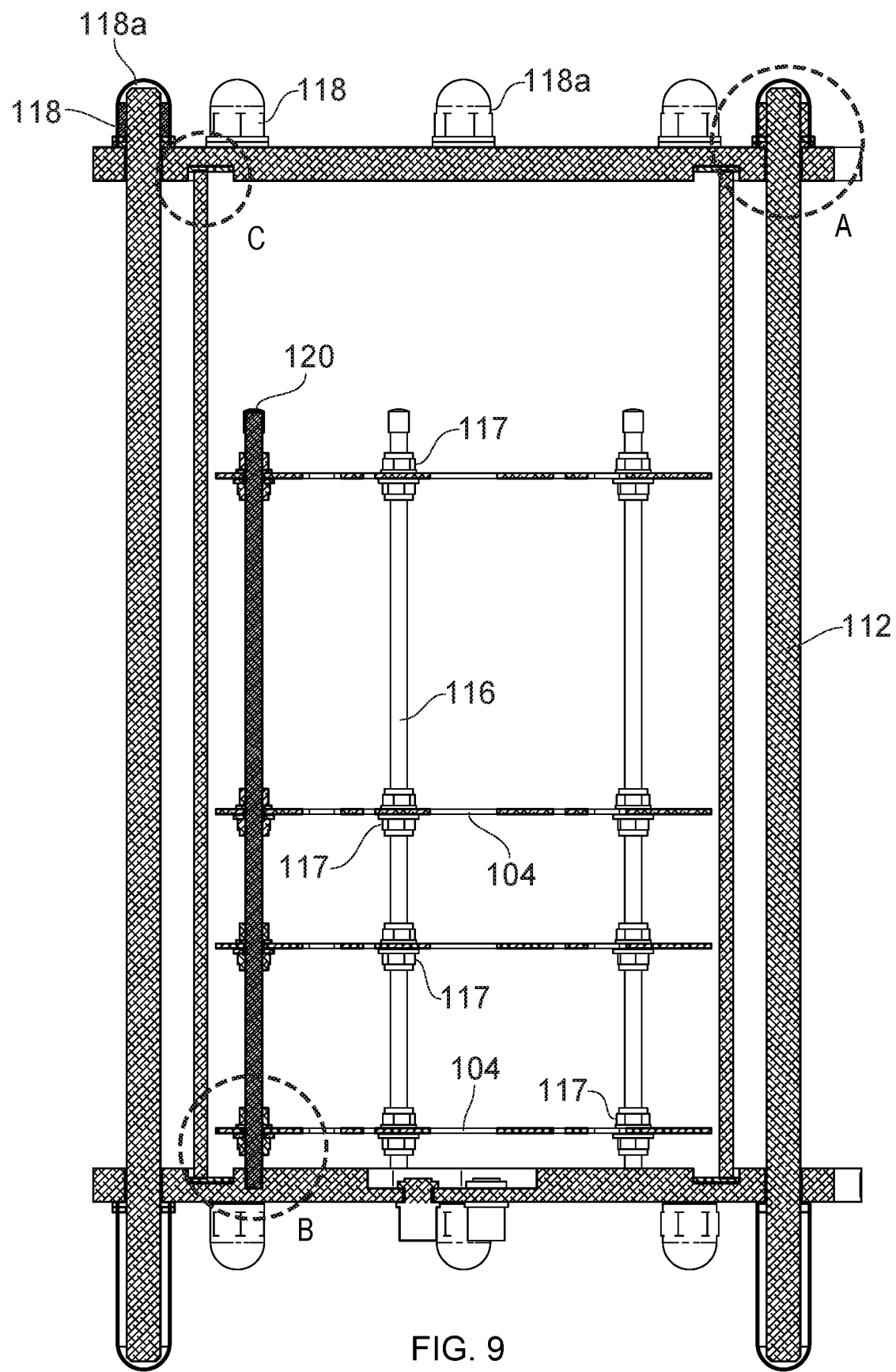
FIG. 9 shows a sectional view through the embodiment shown in FIGS. 8, 8a to 8d and depicts internal rods for supporting mounting plates.
Figure 9A:
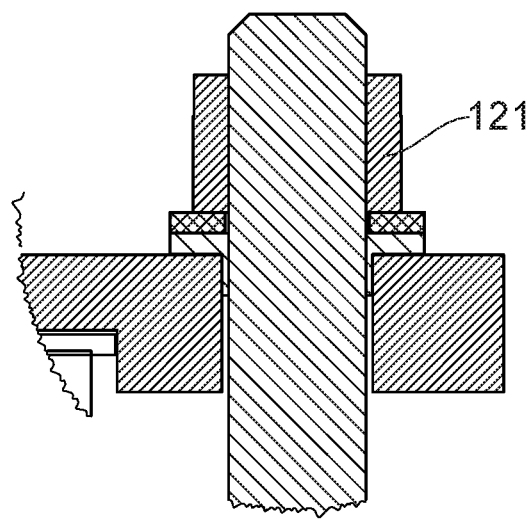
FIGS. 9a, 9b and 9c detailed sectional views depicting how the housing connects to top and bottom plates.
Figure 9B:
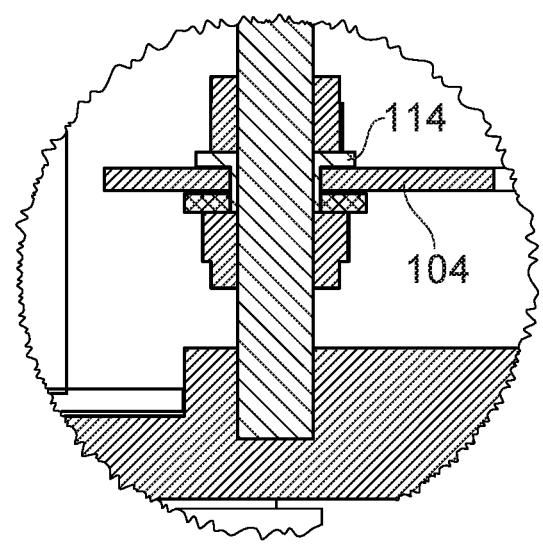
Figure 9C:
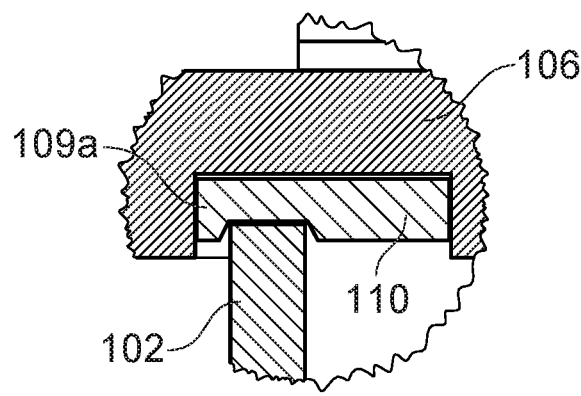

Referring to FIGS. 9a to 9c, at least one rubber or elastomer gasket 110 is disposed in the recesses 109. A clamp means which in this embodiment comprises eight stainless steel shafts 112 exerts a force to clamp the top plate 106 and bottom plate 108 tightly together to seal the housing therebetween. These steel shafts seal the housing and provide rigid supports for strapping as we'll as protect the housing from impact. In this sense they therefore act as an exoskeleton to the housing.

Figure 8E:
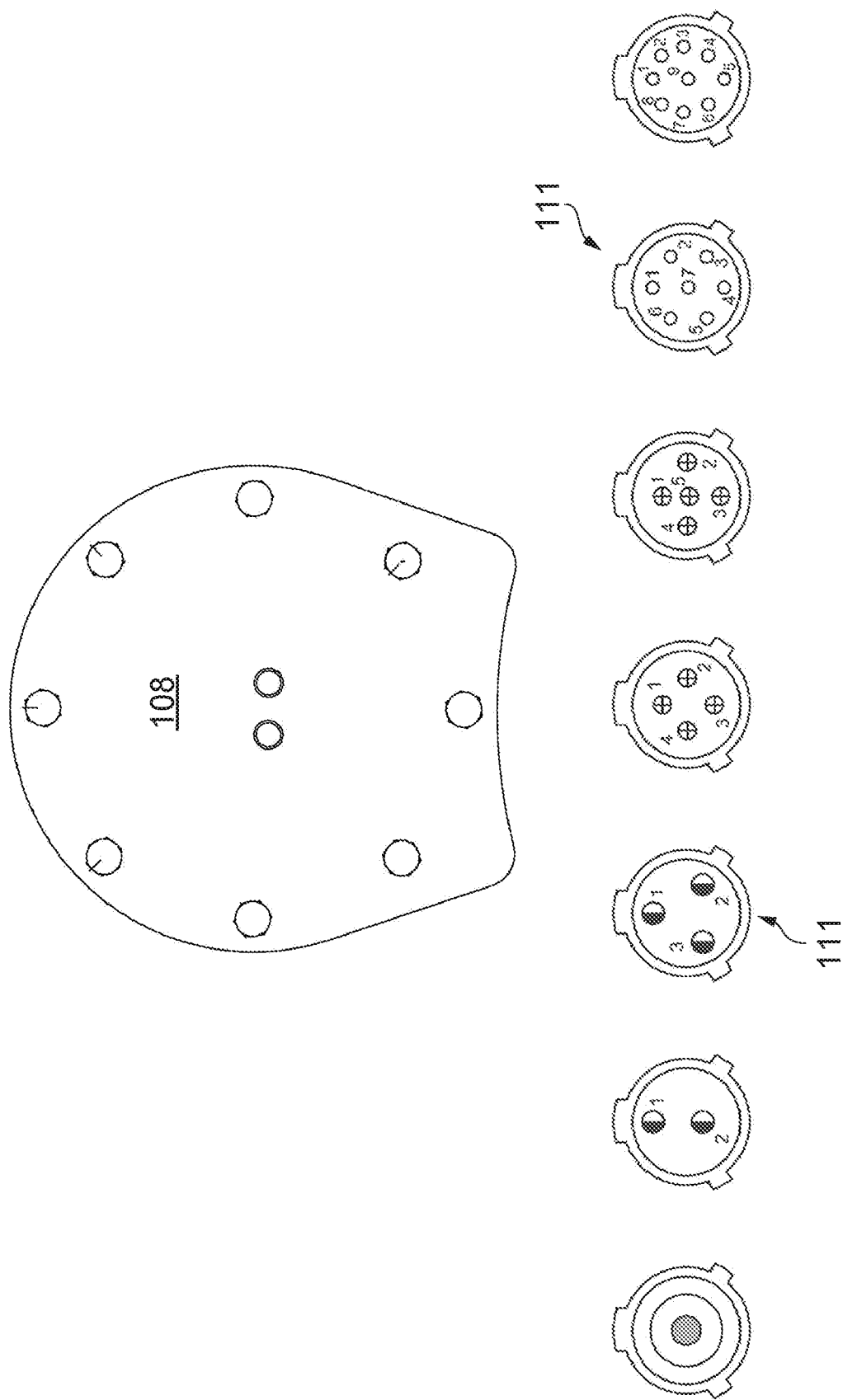
FIG. 8e shows a selection of plugs, sockets and interfaces.

FIG. 8c shows a recess formed in the bottom plate 108 that defines a connector inlet in which a socket 111 is fitted. Examples of sockets are shown in FIG. 8e. Socket 111 receives communication link 61 and a plug 61a which together defines a connector for a power supply and/or a data line, over which data is sent to, and received from, at least one antenna 61b which is exterior of the housing.

Bushes 114 are located around steel rods 116 and steel shafts 112 to isolate the mounting plates 104 from containing the metallic housing which may be important from a perspective of a floating earth or lightening strike.

The heat sink 16 comprises a solid aluminium block with an indentation for the closure mechanism, and lowermost fins 15.

Figure 10A:
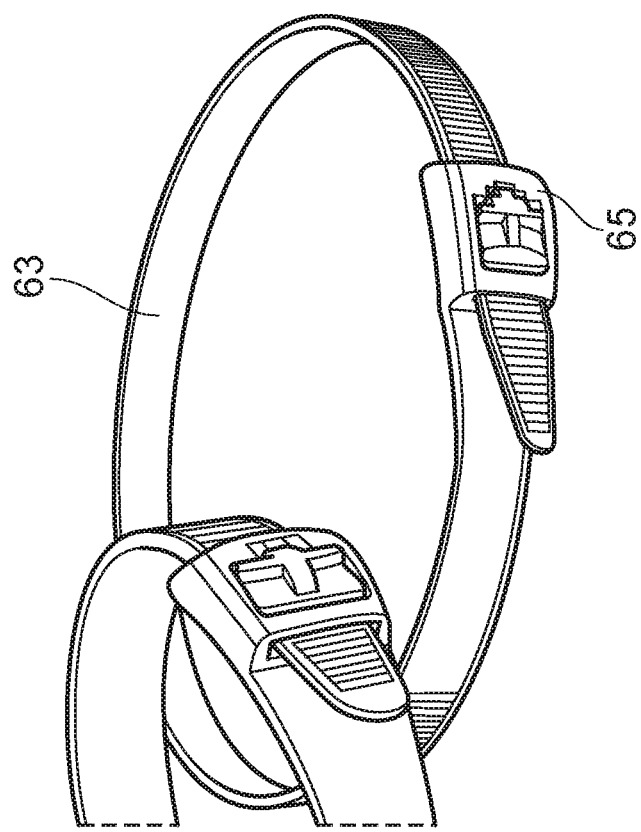
FIG. 10a is a detailed view of the flexible strapping attachment means and closure members.

The embodiment of the flexible strapping attachment means 63 shown in FIG. 10a, may be envisaged to be used on land, and may for example be formed from carbon fibre.

An electronic apparatus has connections through a base 71 of a housing which encloses mounting plates 70 for the apparatus.

A strapping system mounts on marine and land based architecture 8 enabling the creation of nodes and node frames as outlined previously. Heat removal is via a heat sink and is enhanced through an aluminium walled cylindrical tube.

Figure 10:
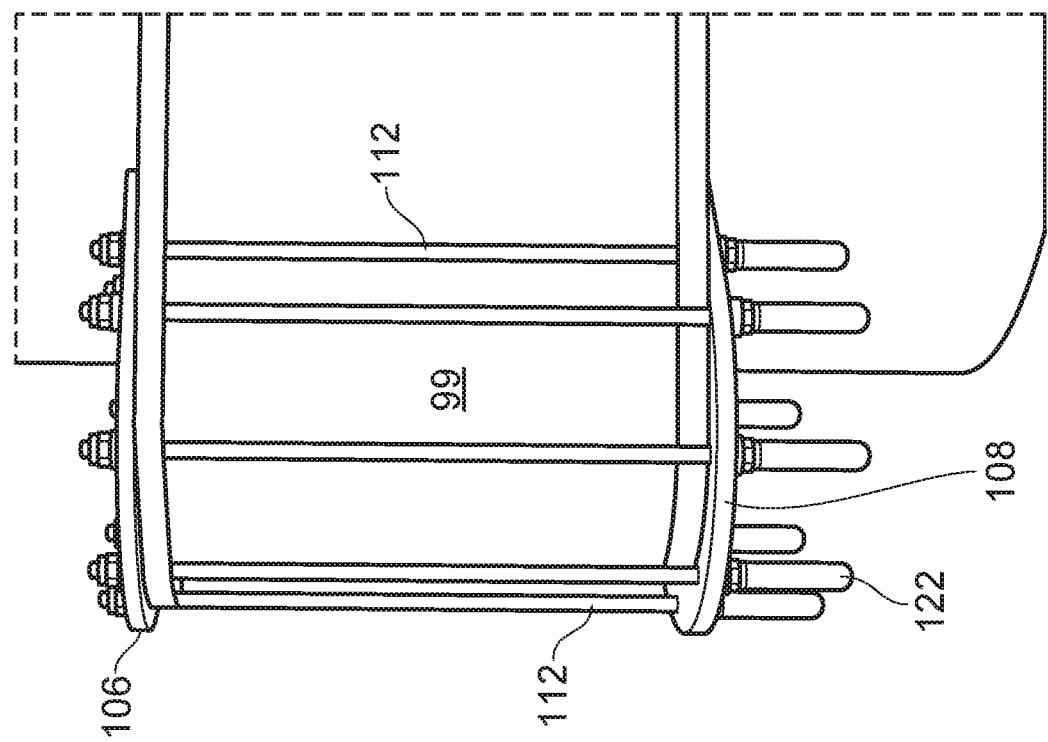
FIG. 10 is a view showing how the housing is connected to a structure using a flexible strapping attachment means.

Referring to FIGS. 8 to 10 metal rods 116 connect and space the mounting plates 104. End stops 120 are disposed on upper ends of the rods 116 and these are formed from an insulating material and prevents any metal to metal contact.

The mounting plates 70 are arranged horizontally and connected together by way of threaded rods 116 and nuts 117 which connect the plates in a rigid configuration while spacing them and components mounted on them. By extending the length of the rods and height of the container an increase in the amount of equipment that can be deployed is achieved by increasing the height of the container 99 and the number of mounting plates. The use of non-metal bushings, shown in detail in FIGS. 9a, 9b and 9c allow for different types of metal to be used together in a pod without any galvanic corrosion.

The container 99 is deployed in an orientation such that the at least one mounting plate has apertures 103 formed therein to improve convective cooling. In addition vertical fins (not shown) may be placed in thermal contact with the mounting plates so as to improve heat transfer from them. Mounting plates 104 have a plurality of apertures 103 formed to improve cooling and prevent buildup of hot spots in the container 99.

A circular periphery and a circular closure mechanism is adapted to engage with the circular periphery so as to close the housing and provide a watertight seal. At least one mounting plate is circular and has a central aperture formed therein.

FIGS. 11 to 23 illustrate the principals of a communication system which includes a plurality of the aforementioned containers deployed in an array or cellular configuration.

A microprocessor (not shown) is operative to process signals for transmission to/from at least one antenna associated with at least one of the containers so that signals received are relayed to a memory and to the microprocessor. The microprocessor is configured to cause transmission of an interrogation signal from at least a first electronic communications device to a second electronic communications device to determine whether the second electronic communications device is operative for call forwarding.

Figure 22:
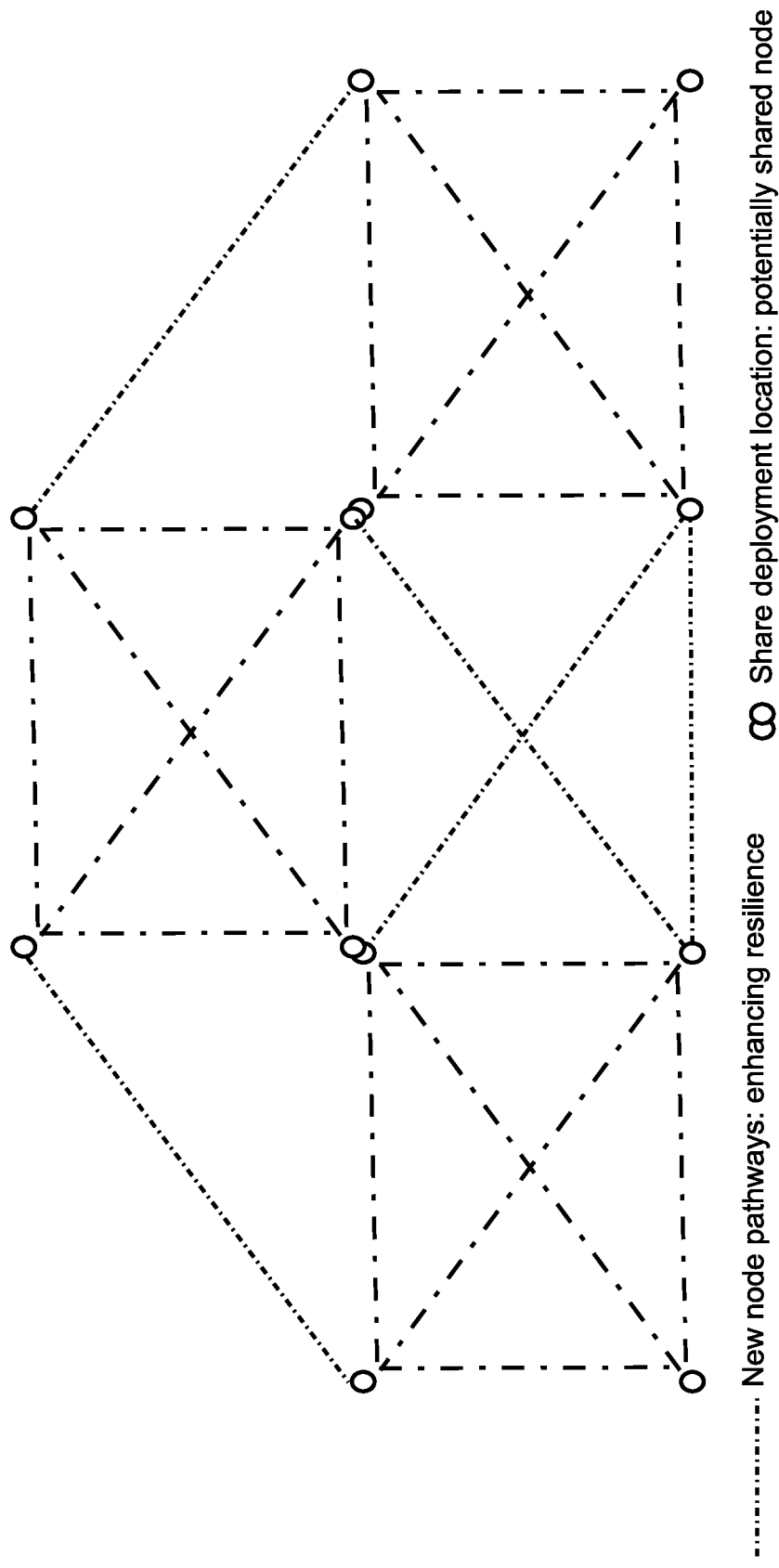
FIG. 22 is a diagram showing shared deployment of nodes within a network of node frames.

In the event that no affirmative reply is received, an alternative pathway is selected, for example as depicted in FIGS. 6 and 22 and tested. This alternative pathway may entail the use of an alternative waveband, channel or transmission mode or type of transmitter. When this occurs the microprocessor is operative to cause a transmitter to broadcast interrogation signals to determine whether other mobile or base stations are present for call forwarding.

Figure 11:
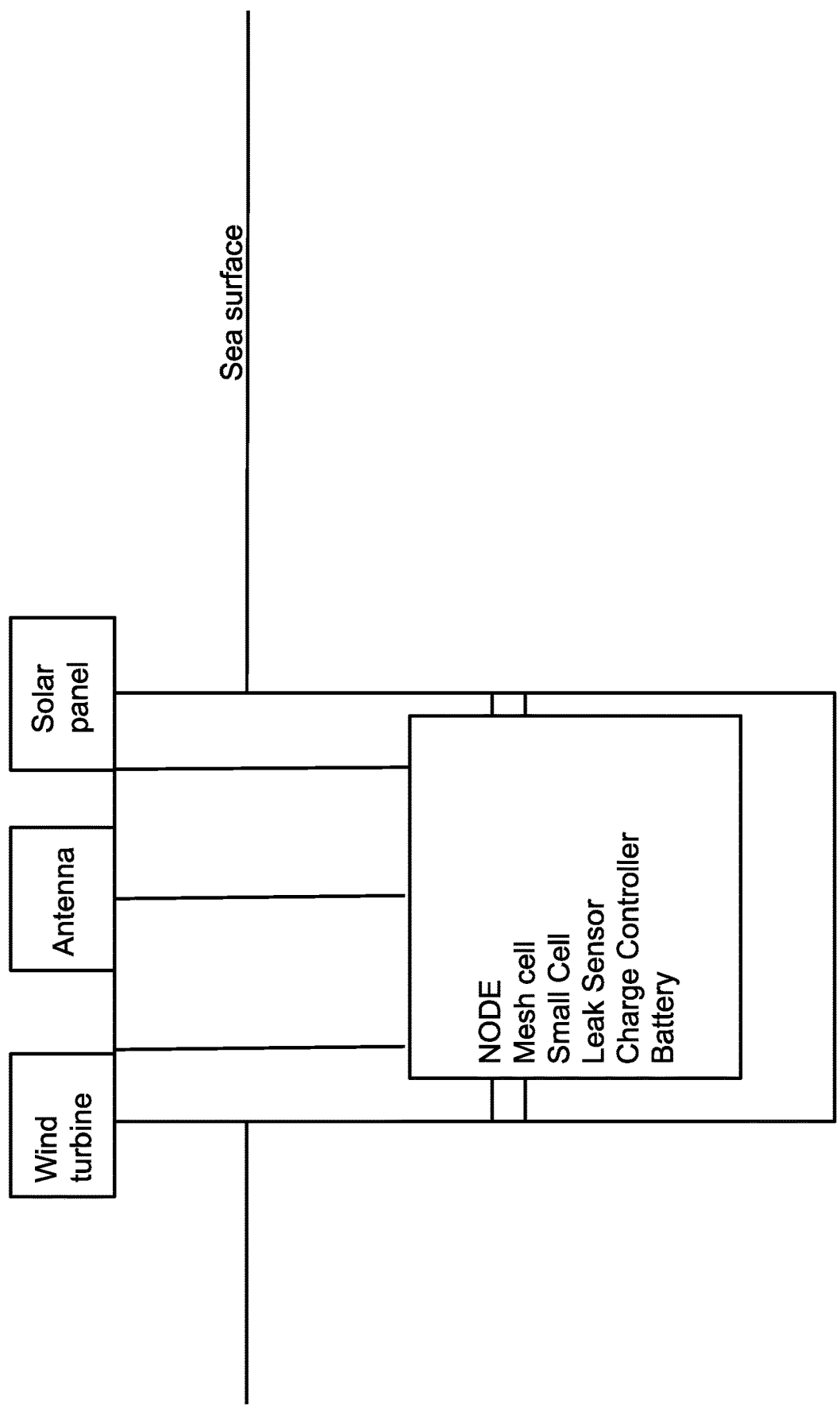
FIG. 11 is a diagrammatic representation of a node, which includes the container, deployed under water and which is secured to a marine channel marker (not shown)

FIG. 11 shows diagrammatically how the container is deployed as a node undersea water, for example when harnessed to a marine channel marker or buoy, (not shown).

Figure 12:
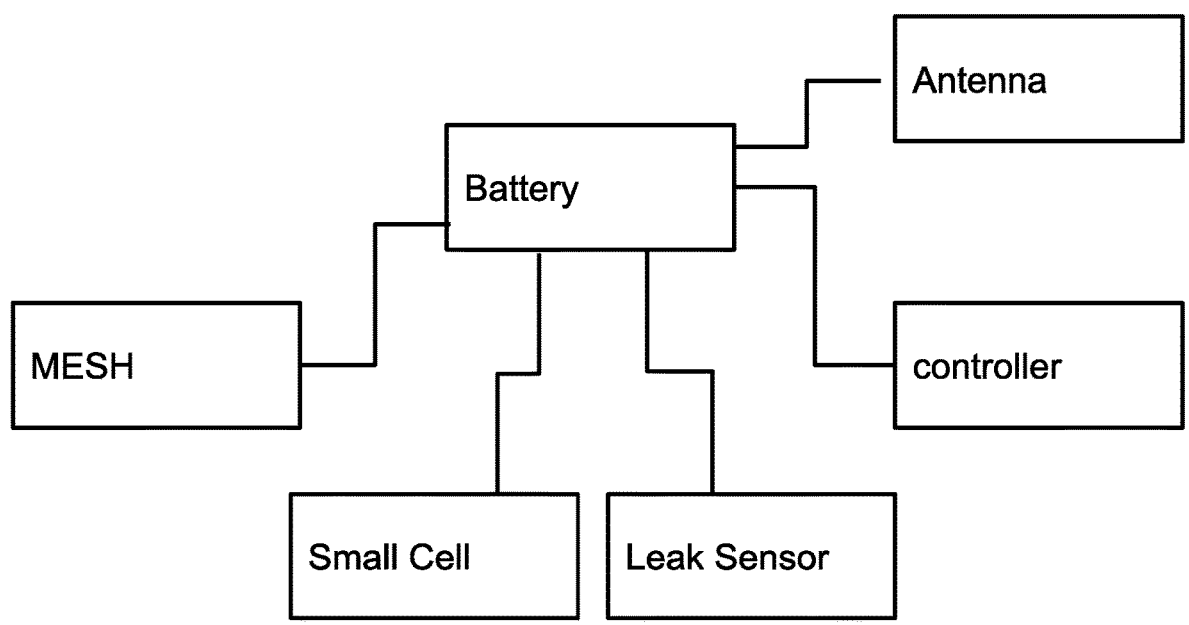
FIG. 12 illustrates the relationship between separate elements in the container and how they are powered by a battery.

FIGS. 12, 13 and 14 show different aspects of the relationship between separate elements within the container and how they are powered by a battery (FIG. 12) and the principle of how a container, is deployed on land and at sea (FIG. 13); and how different external power sources may be connected to the container in order to enable it to be powered by different power sources (FIGS. 13 and 14).

FIG. 14 shows how a solar panel and back-up battery power supplies are configured by a controller 140 in order to ensure continuous and uninterrupted operation of a node. FIG. 16 illustrates the independence of a node as a consequence of the various different power supplies.

Figure 18:
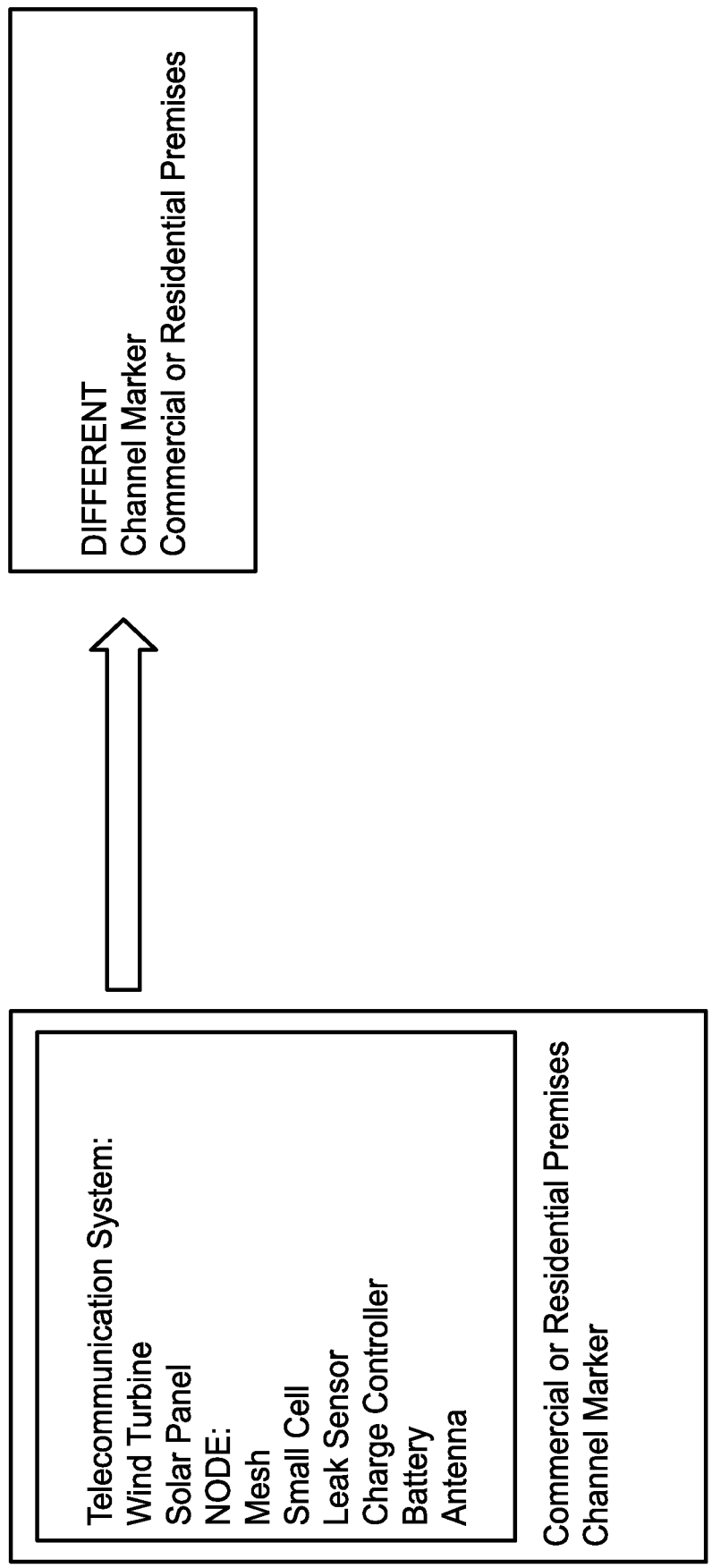
FIG. 18 illustrates the principles of portability of a node within a telecommunications network.

FIGS. 17 and 18 illustrate key features of further embodiments of land and sea based nodes and show how a container fitted to a building or tower is able to be powered by alternative different power sources and operate in conjunction with local networks, such as a small cell or locally meshed network, for example a wi-fi beacon (not shown) in a home or office, and/or a network of conventional (4-G and 5-G) systems.

Figure 19:
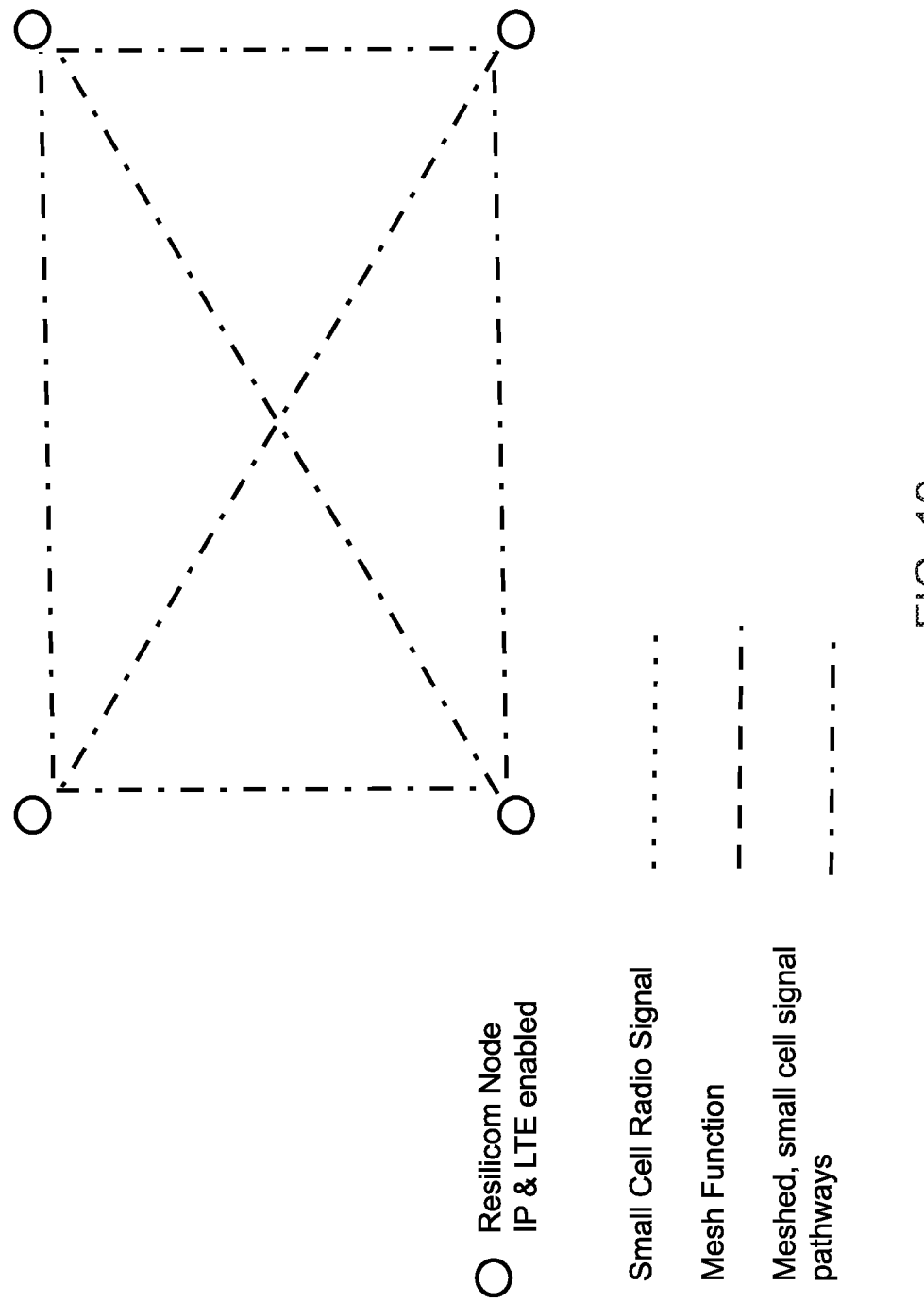
FIG. 19 is a diagrammatical view of triangulated node frame and depicts different functionality.

FIG. 19 illustrates the principles of how small cell radio signals are overlaid as a meshed function in order to show how re-routing between nodes is performed, for example in the event of one of the pathways becoming redundant or damaged, with portability of a node within a telecommunications network. As can be seen from FIG. 20 a series of triangulated node frames improve resilience between land and sea based nodes.

Figure 20:
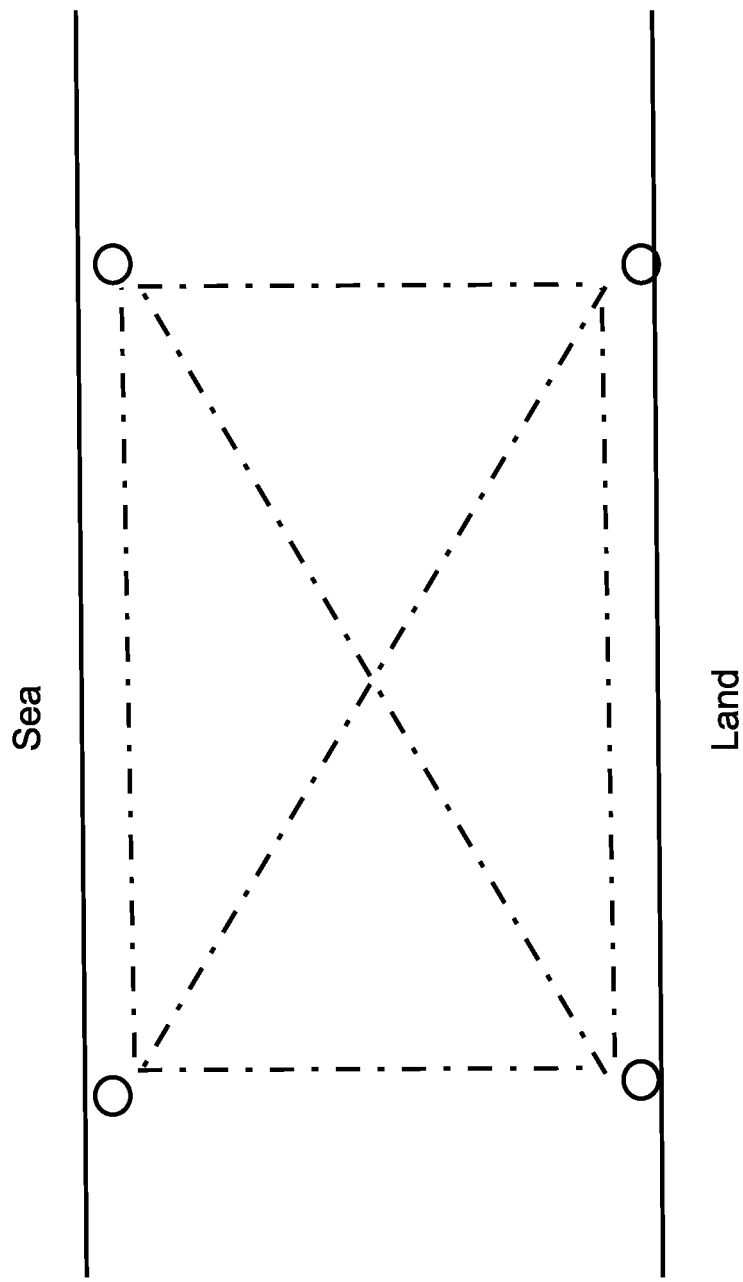
FIG. 20 is a diagrammatical view showing triangulated node frames utilising land and sea.

FIGS. 20 and 22 show further exam pies and how additional nodes provide greater resilience to disruptions in a pathway of a network.

Figure 21:
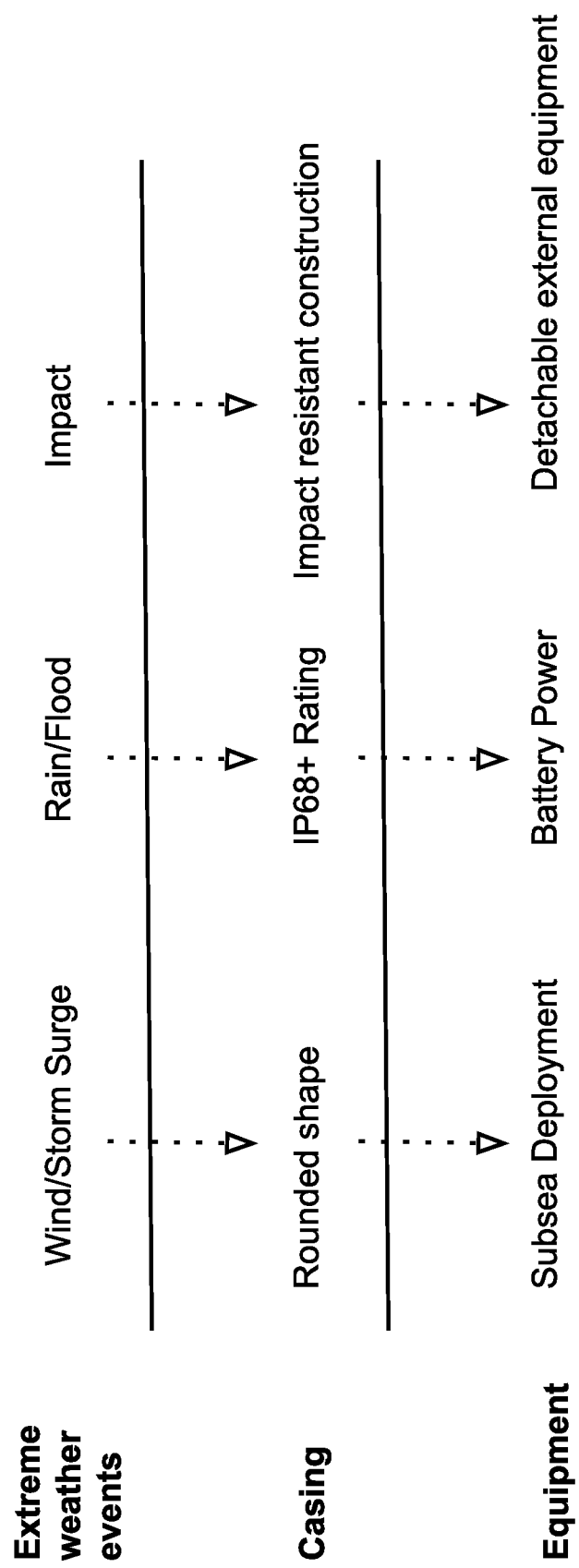
FIG. 21 a diagram showing node resilience against various extreme weather conditions.

FIG. 21 is a table showing the relationship of event and types of casing used in some embodiments of the container in order to improve resilience against various extreme weather conditions.

Figure 23:
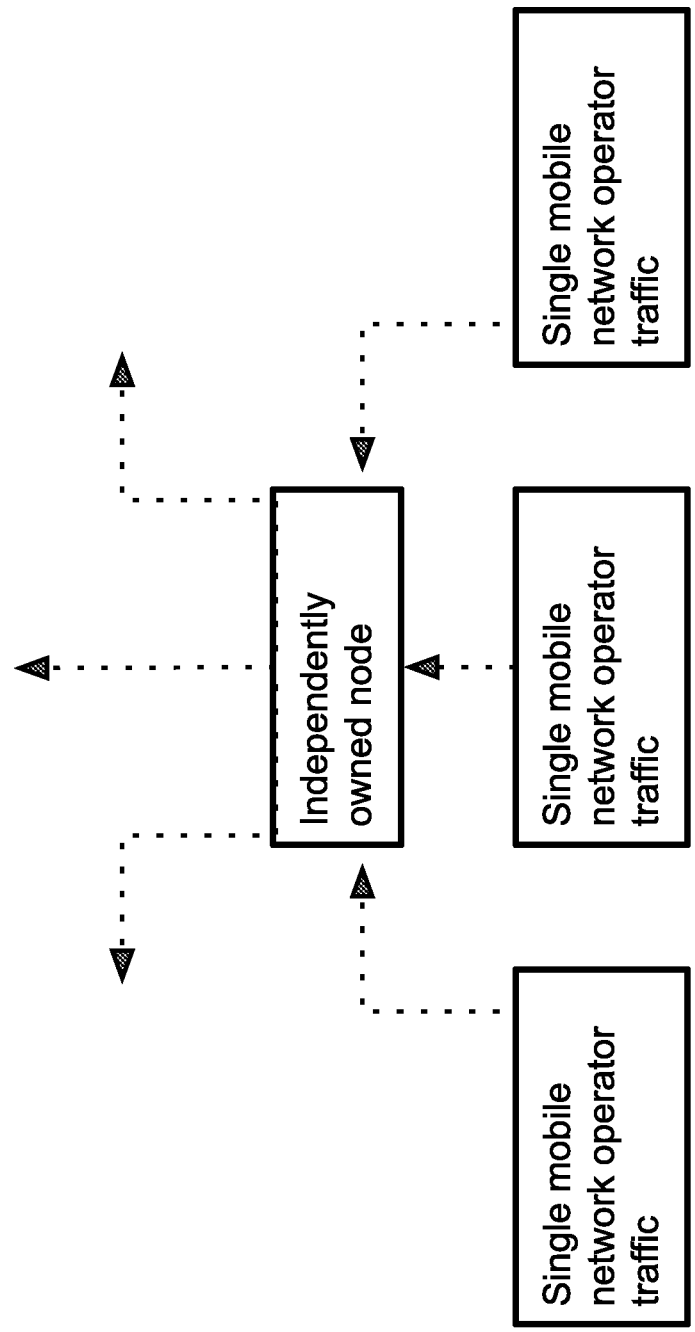
FIG. 23 is a diagrammatical view of a neutrally hosted infrastructure.

FIG. 23 is a diagrammatical view of a neutrally hosted infrastructure and demonstrates how different carriers and network suppliers can use or an independently owned node in order to route or re-route calls via it in order to ensure the integrity of their networks.

The invention has been described by way of examples only and it will be appreciated that variation may be made to the above-mentioned embodiments without departing from the scope of protection as defined by the claims.

LIST OF PARTS 15 fin heat sinks
16 heat sinks
17 rectangular base
26 rectangular plate
42 drum lock ring
44 potting seal
46 telecommunications apparatus
47 waterproof internal enclosure
56 resiliently deformable sealing ring
61 communication link
61a plug
61b antenna
62 housing
63 flexible strapping attachment means
64 attachment points
65 closure mechanism
66 heat sink
70 mounting plate
71 circular base
71a moisture sensor
99 container
100 structure
102 housing
103 apertures
104 mounting plate
106 top plate
108 bottom plate
109a upper recess
109b lower recess
110 gasket
111 socket
112 stainless steel shaft
113 connector inlet
114 bushes
116 steel rods
117 nuts
118 lock nuts
118a end cap
120 ends stops
122 rubber feet
130 wind turbine
140 solar panel
141 controller

The invention claimed is:

1. A container for an electronic communications device includes:

a housing that surrounds at least one mounting plate on which electrical devices and electronic devices are supported, at least one heat sink is in thermal contact with the at least one mounting plate, the at least one heat sink has apertures formed therein to allow convective cooling of the at least one mounting plate;

the housing is received around a top edge by a recess in a top plate and around a bottom edge by a recess in a bottom plate;

at least one rubber or elastomer gasket is disposed in at least one of the recesses;

a clamp means exerts a force to clamp the top and bottom plates to seal the housing therebetween; and a socket which receives a connector for a power supply and/or a data line, over which data is sent to, and received from, at least one antenna which is exterior of the housing, wherein the clamp means comprises a plurality of rigid shafts extending through apertures formed in the top and bottom plates and tightening means is provided on each of the plurality of rigid shafts to press the top edge and the bottom edge into the at least one rubber or elastomer gasket.

2. A container according to claim 1 wherein the clamp means comprises a plurality of connectors, each passing through an aperture formed in at least one of the plates; a resiliently deformable bush is located in each of the apertures and surrounds each of the connectors; and a lock nut is connected to a threaded end of each of the connectors.

3. A container according to claim 1 wherein an interface includes a waterproof connection from an interior of the housing to an exterior of the housing.

4. A container according to claim 1 includes a fan to force a fluid contained within the device to cool the at least one heat sink.

5. A container according to claim 1 wherein internal surface of the housing has protuberances formed thereon to promote cooling.

6. A container according to claim 5 wherein the protuberances are fins.

7. A container according to claim 5 wherein the protuberances follow a helical path.

8. A container according to claim 1 wherein the at least one mounting plate is arranged so that when the electronic communications device is deployed, the at least one mounting plate is retained horizontally, and vertical fins extend therefrom to improve convective cooling of the at least one mounting plate.

9. A container according to claim 1 wherein the at least one antenna is from the group comprising: a short range radio frequency (RF) antenna, a VHF RF antenna, a wireless local area network (LAN) RF antenna, a short-range personal wireless area network, such as Bluetooth®, RF antenna, a 3-G RF antenna, a 4-G RF antenna and a 5-G RF antenna.

10. A container according to claim 1 has at least one lanyard attachment point on an exterior of the housing.

11. A container according to claim 1 wherein the at least one heat sink has fins.

12. A container according to claim 1 wherein the at least one mounting plate has at least one cooling fin in contact therewith, the cooling fin is retained vertically in order to improve convective cooling from the mounting plate.

13. A container according to claim 1 wherein the at least one mounting plate has a plurality of apertures formed therein.

14. A container according to claim 1 wherein the housing has a circular periphery and a circular closure mechanism which is adapted to engage with the circular periphery so as to close the housing and provide a watertight seal.

15. A container according to claim 1 has a local source of electrical power, provided by a battery, photovoltaic (PV) solar panel or a wind turbine.

16. A container according to claim 1 includes at least one sensor which is operative to sense a fault from the group comprising: a fault on a power line, a low level of an on-board battery, a signal line fault, a fault with a neighbouring base station and a fault with one or more communication channels, and when a fault is sensed a transmitter transmits an alert signal indicating the fault.

17. A container according to claim 1 wherein the heat sink includes an aluminium tube.

18. A communication system includes
a plurality of containers according to claim 1 which are deployed in a cellular arrangement;
a microprocessor is operative to process signals for transmission to at least one antenna and signals received from at least one antenna;
a memory is coupled to the microprocessor; and
a power supply.

19. A system according to claim 18 wherein the microprocessor is configured to cause transmission of an interrogation signal from a first electronic communications device within a first of the plurality of containers, to a second electronic communications device within a second of the plurality of containers, to determine whether the second electronic communications device is operative for call forwarding.

20. A system according to claim 18 wherein the microprocessor is operative to cause a transmitter to broadcast interrogation signals to determine whether another mobile or base station is present for call forwarding.

* * * * *